United States Patent
Osawa et al.

(10) Patent No.: US 11,340,528 B2
(45) Date of Patent: May 24, 2022

(54) PRODUCTION METHOD OF COMPOSITION FOR RESIST TOP COAT LAYER, METHOD OF FORMING RESIST PATTERN, PRODUCTION METHOD OF FLUORINE-CONTAINING RESIN, AND METHOD OF IMPROVING WATER REPELLENCY OF RESIST TOP COAT LAYER

(71) Applicant: JSR CORPORATION, Tokyo (JP)

(72) Inventors: Sosuke Osawa, Tokyo (JP); Kosuke Terayama, Tokyo (JP); Hajime Inami, Tokyo (JP); Kanako Ueda, Tokyo (JP); Atsuto Nishii, Tokyo (JP)

(73) Assignee: JSR CORPORATION, Tokyo (JP)

( * ) Notice: Subject to any disclaimer, the term of this patent is extended or adjusted under 35 U.S.C. 154(b) by 77 days.

(21) Appl. No.: 16/710,277

(22) Filed: Dec. 11, 2019

(65) Prior Publication Data

US 2021/0181630 A1   Jun. 17, 2021

(51) Int. Cl.
| | | |
|---|---|---|
| G03F 7/004 | (2006.01) | |
| G03F 7/11 | (2006.01) | |
| G03F 7/028 | (2006.01) | |
| G03F 7/032 | (2006.01) | |
| C08F 220/18 | (2006.01) | |
| G03F 7/20 | (2006.01) | |
| G03F 7/16 | (2006.01) | |
| G03F 7/039 | (2006.01) | |

(52) U.S. Cl.
CPC .......... *G03F 7/0046* (2013.01); *C08F 220/18* (2013.01); *G03F 7/0048* (2013.01); *G03F 7/028* (2013.01); *G03F 7/032* (2013.01); *G03F 7/0397* (2013.01); *G03F 7/11* (2013.01); *G03F 7/16* (2013.01); *G03F 7/2041* (2013.01)

(58) Field of Classification Search
None
See application file for complete search history.

(56) References Cited

U.S. PATENT DOCUMENTS

| | | | | |
|---|---|---|---|---|
| 3,438,946 A | * | 4/1969 | Lichstein | C07C 69/63 528/299 |
| 2003/0129931 A1 | * | 7/2003 | Konno | B24B 37/205 451/285 |
| 2010/0255416 A1 | | 10/2010 | Kouno et al. | |
| 2012/0021359 A1 | * | 1/2012 | Hayama | C08F 220/18 430/319 |
| 2012/0271020 A1 | * | 10/2012 | Suzuki | C07C 245/04 526/215 |
| 2013/0078571 A1 | * | 3/2013 | Serizawa | G03F 7/0397 430/270.1 |
| 2013/0217850 A1 | * | 8/2013 | Tanaka | C08F 20/28 526/244 |
| 2014/0248563 A1 | * | 9/2014 | Tanaka | G03F 7/0388 430/296 |
| 2015/0361026 A1 | * | 12/2015 | Oomuro | C08F 220/22 560/227 |
| 2017/0075221 A1 | * | 3/2017 | Nakagawa | G03F 7/0392 |
| 2017/0240666 A1 | * | 8/2017 | Lu | C08F 14/18 |
| 2017/0255103 A1 | * | 9/2017 | Rowell | H01L 21/02057 |
| 2019/0249000 A1 | * | 8/2019 | Sakurai | C08L 101/02 |

FOREIGN PATENT DOCUMENTS

| | | | | |
|---|---|---|---|---|
| CN | 104693408 A | * | 6/2015 | |
| CN | 106575082 A | * | 4/2017 | ............ G03F 7/039 |
| JE | 5229228 B2 | | 7/2013 | |
| JP | 2018066010 A | * | 4/2018 | |
| WO | WO-2018084084 A1 | * | 5/2018 | ............ C08L 101/04 |

* cited by examiner

Primary Examiner — Nicole M. Buie-Hatcher
(74) Attorney, Agent, or Firm — Element IP, PLC

(57) ABSTRACT

Disclosed herein is a method for producing a composition for resist top coat layer, the method including: polymerizing a monomer solution containing a fluorine-containing monomer in a presence of a polymerization initiator that cleaves to generate an active species having 7 or more carbon atoms in total to obtain a fluorine-containing resin A; and mixing the fluorine-containing resin A and a solvent.

16 Claims, No Drawings

PRODUCTION METHOD OF COMPOSITION FOR RESIST TOP COAT LAYER, METHOD OF FORMING RESIST PATTERN, PRODUCTION METHOD OF FLUORINE-CONTAINING RESIN, AND METHOD OF IMPROVING WATER REPELLENCY OF RESIST TOP COAT LAYER

BACKGROUND OF THE INVENTION

Field of the Invention

The present invention relates to a method for producing a composition for resist top coat layer, a method for forming a resist pattern, a method for producing a fluorine-containing resin, and a method for improving water repellency of a resist top coat layer.

Discussion of the Background

A photolithography technique using a resist material is employed in forming a fine circuit in a semiconductor element. According to this, for example, an acid is generated by exposure using radiation via a mask pattern on a coating film of the resist material, and difference in solubility to a development liquid of the resist material is generated at the exposed part and at the non-exposed part by reaction using the acid as a catalyst, thereby to form a resist pattern on a substrate.

In the above photolithography technique, miniaturization of the circuit is achieved by using a short-wavelength radiation such as an excimer laser; however, further miniaturization is demanded due to the needs for scale reduction and higher capacity. Accordingly, as a miniaturization application technique, a liquid immersion lithography method is used that performs exposure in a state in which a space between the lens of an exposure apparatus and the resist film is filled with a liquid medium. According to this liquid immersion lithography method, the aforementioned space is filled with a liquid medium (for example, water) having a larger refractive index (n) in place of a gas such as air or nitrogen, so that the numerical aperture increases, and resolution and focal depth can be improved.

In resist pattern formation by liquid immersion lithography, problems caused by using a liquid medium such as water may occur, such as elution of a resist film and reduction in developability. In order to solve such problems, a technique is known, in which a water-repellent top coat layer is used as a protective film on a resist film (Japanese Patent No. 5229228).

SUMMARY OF THE INVENTION

In recent years, speed-up of scanning speed in liquid immersion lithography is required to increase throughput. When high-speed scanning is performed in a state where a top coat layer is poor in water repellency, there is a fear that a defect (watermark defect) such that a water droplet remains on the film surface after scanning. In order to prevent such a watermark defect, improvement in the water-repellency (especially, dynamic receding contact angle) of a top coat layer is effective.

In order to improve the water-repellency of a top coat layer, the fluorine atom content in a resin forming the top coat layer may be increased. However, when the fluorine atom content is excessively increased, there is a case where the solubility of the resin in a solvent or the coatability of a solution is reduced.

One aspect of the present invention is directed to a method for producing a composition for resist top coat layer, the method including: polymerizing a monomer solution containing a fluorine-containing monomer in a presence of a polymerization initiator that cleaves to generate an active species containing 7 or more carbon atoms in total to obtain a fluorine-containing resin A; and mixing the fluorine-containing resin A and a solvent.

Another aspect of the present invention is directed to a method for forming a resist pattern, the method including: polymerizing a monomer solution containing a fluorine-containing monomer in a presence of a polymerization initiator that cleaves to generate an active species containing 7 or more carbon atom in total to obtain a fluorine-containing resin A; mixing the fluorine-containing resin A and a solvent to prepare a composition for resist top coat layer; applying the composition for resist top coat layer onto a resist film to form a liquid immersion top coat layer; and subjecting the resist film having the liquid immersion top coat layer formed thereon to liquid immersion lithography; and developing the resist film subjected to liquid immersion lithography.

Another aspect of the present invention is directed to a method for producing a fluorine-containing resin, the method including polymerizing a monomer solution containing a fluorine-containing monomer in a presence of a polymerization initiator that cleaves to generate an active species containing 7 or more carbon atoms in total.

Another aspect of the present invention is directed to a method for improving water-repellency of a resist top coat layer, the method including: polymerizing a monomer solution containing a fluorine-containing monomer in a presence of a polymerization initiator that cleaves to generate an active species containing 7 or more carbon atoms in total to obtain a fluorine-containing resin A; mixing the fluorine-containing resin A and a solvent to prepare a composition for resist top coat layer; and applying the composition for resist top coat layer onto a resist film to form a liquid immersion top coat layer.

DESCRIPTION OF THE EMBODIMENTS

An embodiment of the present invention relates to a method for producing a composition for resist top coat layer, the method including:

polymerizing a monomer solution containing at least a fluorine-containing monomer in the presence of a polymerization initiator that cleaves to generate an active species containing 7 or more carbon atoms in total to obtain a fluorine-containing resin A; and mixing the fluorine-containing resin A and a solvent.

The method for producing a composition for resist top coat layer uses, as a polymerization initiator for synthesizing a resin, a polymerization initiator that cleaves to generate an active species containing 7 or more carbon atoms in total, which surprisingly makes it possible to efficiently produce a composition for resist top coat layer that is capable of forming a resist top coat layer having excellent water-repellency without increasing the content of fluorine atoms. The reason for this is not clear, but can be expected as follows. The polymerization initiator whose total number of carbon atoms is large is more hydrophobic than a conventional one, and therefore binding of such a polymerization initiator to the end of a fluorine-containing resin dramatically improves the hydrophobicity and water-repellency of the resin due to the effect of the end group. Therefore, it can be considered that when a resist top coat layer is formed using a composition containing the fluorine-containing resin, phase separation between the fluorine atom-containing resin and another component is promoted so that the hydrophobic fluorine-containing resin is locally distributed at the surface of the top coat layer and the top coat layer has excellent water-repellency. It is to be noted that in this description, the term "dynamic receding contact angle" refers to a contact angle between a water droplet and a resist top coat layer at the rear end point of the water droplet in the direction of water droplet movement, and a larger dynamic receding contact angle means higher water-repellency or hydrophobicity of the surface of the top coat layer.

Another embodiment of the present invention relates to a method for forming a resist pattern, the method including:

polymerizing a monomer solution containing at least a fluorine-containing monomer in the presence of a polymerization initiator that cleaves to generate an active species containing 7 or more carbon atoms in total to obtain a fluorine-containing resin A;

mixing the fluorine-containing resin A and a solvent to prepare a composition for resist top coat layer;

applying the composition for resist top coat layer onto a resist film to form a liquid immersion top coat layer; and subjecting the resist film having the liquid immersion top coat layer formed thereon to liquid immersion lithography; and developing the resist film subjected to liquid immersion lithography.

The method for forming a resist pattern uses a composition for resist top coat layer obtained by the above-described method for producing a composition for resist top coat layer, and therefore a resist film excellent in dynamic receding contact angle can be formed and throughput of resist pattern formation can be improved.

Another embodiment of the present invention relates to a method for producing a fluorine-containing resin, the method including polymerizing a monomer solution containing at least a fluorine-containing monomer in the presence of a polymerization initiator that cleaves to generate an active species containing 7 or more carbon atoms in total.

The method for producing a fluorine-containing resin makes it possible to produce a fluorine-containing resin suitable for the above-described composition for resist top coat layer at good yield.

Another embodiment of the present invention relates to a method for improving water-repellency of a resist top coat layer, the method including:

polymerizing a monomer solution containing at least a fluorine-containing monomer in the presence of a polymerization initiator that cleaves to generate an active species containing 7 or more carbon atoms in total to obtain a fluorine-containing resin A;

mixing the fluorine-containing resin A and a solvent to prepare a composition for resist top coat layer; and applying the composition for resist top coat layer onto a resist film to form a liquid immersion top coat layer.

The method for improving water repellency of a resist top coat layer uses a composition for resist top coat layer obtained by the above-described method for producing a composition for resist top coat layer, and therefore a resist film having a large dynamic receding contact angle and excellent water-repellency can efficiently be formed.

<<Method for Producing Composition for Resist Top Coat Layer>>

<Polymerization Step>

In the polymerization step, a monomer solution containing at least a fluorine-containing monomer is polymerized in the presence of a polymerization initiator that cleaves to generate an active species containing 7 or more carbon atoms in total to obtain a fluorine-containing resin A.

(Polymerization Initiator)

The polymerization initiator is not particularly limited as long as the total number of carbon atoms present in an active species generated by cleavage is 7 or more, and may either be a radical polymerization initiator or an ion polymerization initiator. An active species generated from a radical polymerization initiator refers to a portion having a free radical generated by the cleavage of an activation site relatively lower in binding energy by an external stimulus such as heat or light, and an active species generated from an ion polymerization initiator refers to a portion having a cation or an anion generated by an external stimulus such as heat or light. It is to be noted that a portion that forms a counterion before a reaction with a monomer and becomes a cationic portion or an anionic portion by cleavage (dissociation) in the stage of a reaction with a monomer (a transition stage is included) is also recognized as an active species.

In this embodiment, the total number of carbon atoms present in the active species is 7 or more. The carbon atoms present in the active species refer to all the carbon atoms present in the active species irrespective of their existence form. More specifically, not only carbon atoms forming the skeleton of an organic group as a main portion of the active species but also carbon atoms in a substituent on the organic group or carbon atoms in a functional group present as a substituent are included. Examples of the functional group containing a carbon atom include a cyano group, a carboxyl group, a carbonyl group, an isocyanate group, and an isocyano group. For example, when the active species is represented by a chemical formula, $C_aH_bX_cX_d$ ($X_c$ and $X_d$ are heteroatoms other than a carbon atom and a hydrogen atom or metallic atoms, the chemical formula of the active species is not limited thereto), the total number of carbon atoms present in the active species is a. The total number of carbon atoms present in the active species is not particularly limited as long as it is 7 or more. The lower limit of the total number may be any one of 8, 9, 10, 11, 12, and 13. The upper limit of the total number of carbon atoms may be any one of 20, 19, 18, 17, 16, 15, and 14.

The structure of the polymerization initiator is not particularly limited as long as the total number of carbon atoms present in the active species is 7 or more. However, the polymerization initiator preferably has an alicyclic structure, an aromatic ring structure, or a chain hydrocarbon structure.

The alicyclic structure preferably has 3 to 12 carbon atoms. The alicyclic structure may either be a saturated alicyclic monocyclic structure or a saturated alicyclic polycyclic structure. Examples of the saturated alicyclic monocyclic structure include monocyclic cycloalkyl structures having 3 to 12 carbon atoms, such as cyclopropane, cyclobutane, cyclopentane, and cyclohexane. Examples of the saturated alicyclic polycyclic structure include polycyclic cycloalkane structures such as norbornane, adamantane, tricyclodecane, and tetracyclododecane.

Particularly, the alicyclic structure is preferably represented by the following formula (1):

(1)

(wherein $R^x$ is a cyano group or an alkoxycarbonyl group having 2 to 8 carbon atoms, n is an integer of 0 to 8, δ is an integer of 0 to (2n+5), * is a binding site for another portion, and when two or more $R^x$s are present, the $R^x$s are the same or different from each other).

Examples of the alkoxycarbonyl group having 2 to 8 carbon atoms include a methoxycarbonyl group, an ethoxycarbonyl group, and a propoxycarbonyl group. It is to be noted that the number of carbon atoms herein refers to the number of carbon atoms including a carbonyl carbon atom.

The alicyclic structure is more preferably represented by the following formula (1-1):

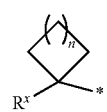
(1-1)

(wherein $R^x$ is a cyano group or an alkoxycarbonyl group having 2 to 8 carbon atoms, n is an integer of 2 to 6, and * is a binding site for another portion).

The alkoxycarbonyl group having 2 to 8 carbon atoms is the same as that described above with reference to the formula (1). Particularly, a methoxycarbonyl group and an ethoxycarbonyl group are preferred.

Specific preferred examples of the alicyclic structure include structures represented by the following formulas.

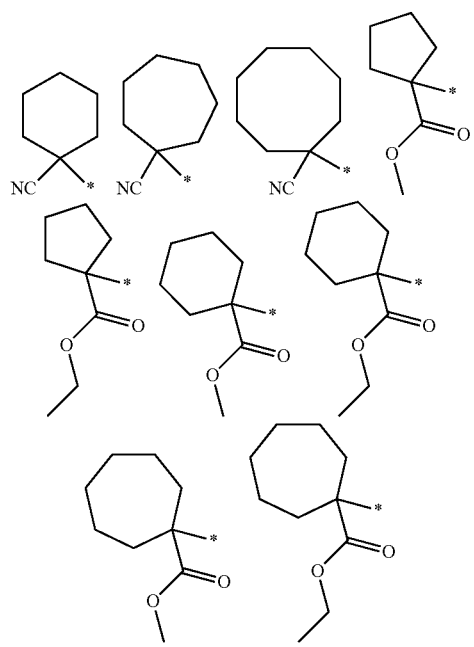

The polymerization initiator may have a chain hydrocarbon structure having 5 to 12 carbon atoms. Examples of the chain hydrocarbon structure having 5 to 12 carbon atoms include linear hydrocarbon groups such as a n-pentyl group, a n-hexyl group, a n-heptyl group, and a n-octyl group; and branched hydrocarbon groups represented by the following formulas.

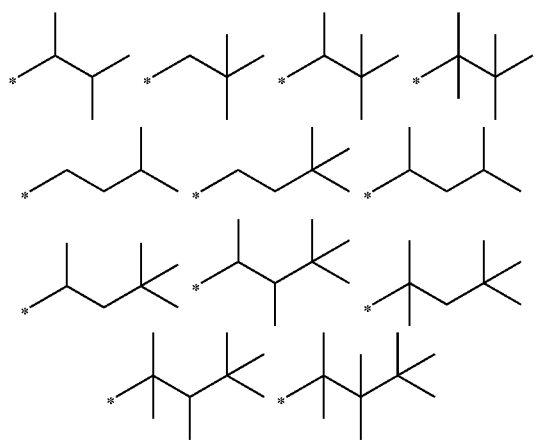

The chain hydrocarbon structure may have, as a substituent, at least one of an ester bond and a cyano group. If necessary, these structures and the chain hydrocarbon structure may be combined so that the total number of carbon atoms present in the active species becomes 7 or more. Structures represented by the following formulas are preferred.

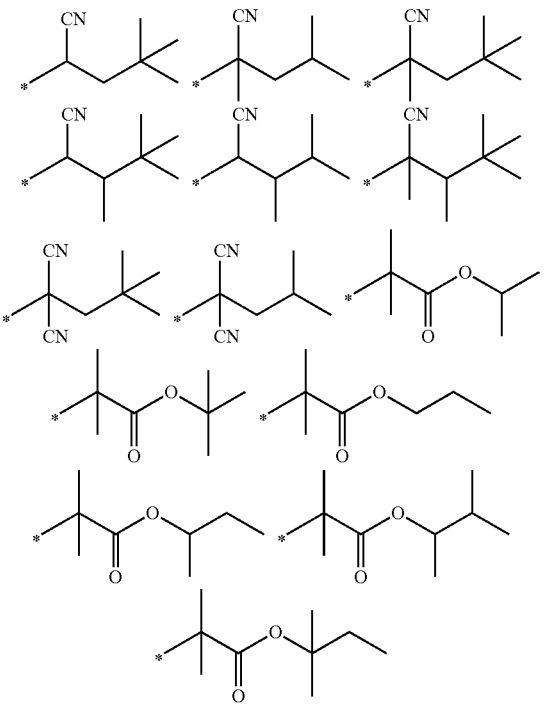

From the viewpoint of controllability of a resin synthetic reaction or easiness of imparting water-repellency to the resin, the polymerization initiator is preferably a radical polymerization initiator, more preferably an azo-based polymerization initiator or an organic peroxide-based polymerization initiator. In the case of an azo-based polymerization initiator, the above-described alicyclic structure or chain hydrocarbon structure can appropriately be introduced. In the case of an organic peroxide-based polymerization initiator, an aromatic ring structure can appropriately be introduced. The aromatic ring structure is not particularly limited, but is preferably an aralkyl group such as a 2-phenylpropan-2-yl group or an aryl carbonyl group such as a phenyl carbonyl group.

The polymerization initiator is preferably represented by any one of the following formulas (a-1) to (a-16).

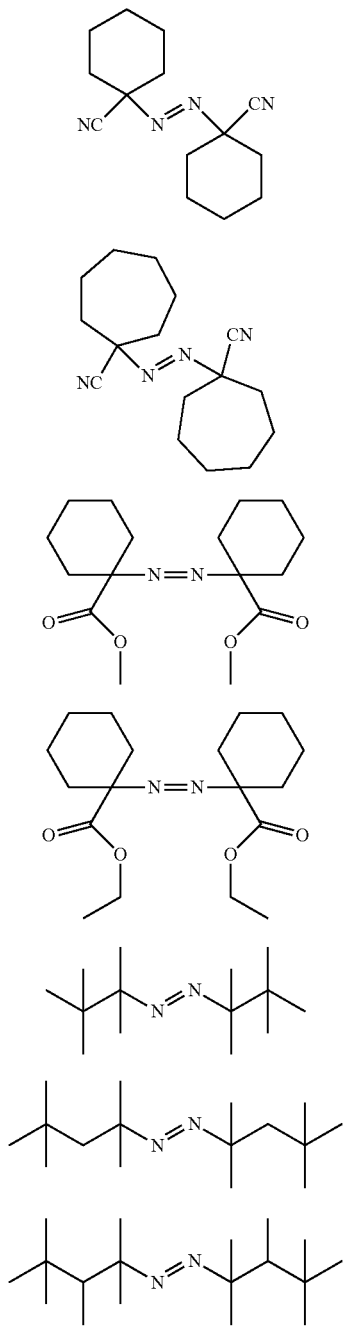

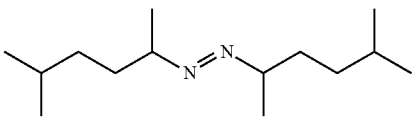

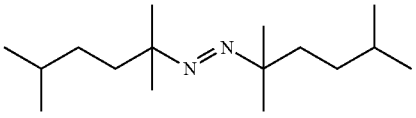

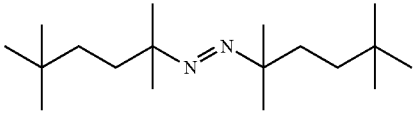

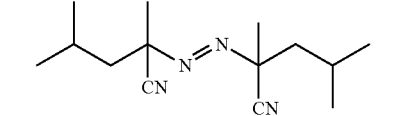

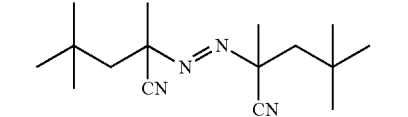

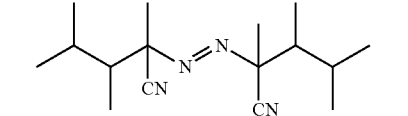

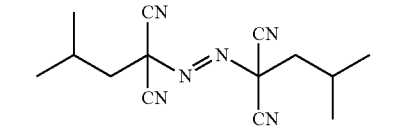

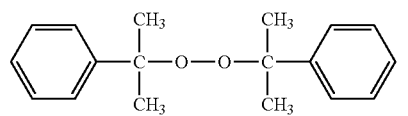

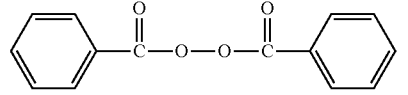

(Synthesis of Fluorine-Containing Resin A)

The fluorine-containing resin A is contained in the composition for resist top coat layer as a resin mainly playing the role of imparting water-repellency among resins constituting a top coat layer. The fluorine-containing resin A can be synthesized by polymerizing a monomer solution containing at least a fluorine-containing monomer in the presence of the above-described polymerization initiator. The monomer solution preferably contains a polymerization solvent in addition to the fluorine-containing monomer. The fluorine-containing resin A is synthesized using the polymerization initiator according to this embodiment, and therefore can exhibit excellent water-repellency at a conventional fluorine atom content without increasing the content of fluorine atoms.

The fluorine-containing monomer is not particularly limited as long as a fluorine atom is contained and a polymerization reaction is allowed to proceed by the above-described polymerization initiator. The monomer solution can contain at least one fluorine-containing monomer, but preferably contains two or more fluorine-containing monomers. This makes it possible to appropriately adjust water-repellency required of a top coat layer or affinity for a resist film.
(First Fluorine-Containing Monomer)

The monomer solution preferably contains a first fluorine-containing monomer having a partial structure represented by the following formula (2).

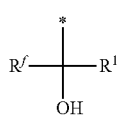

(2)

(wherein $R^f$ is a fluorine atom or a fluoroalkyl group having 1 to 3 carbon atoms, $R^1$ is a hydrogen atom, a fluorine atom, an alkyl group having 1 to 3 carbon atoms, or a fluoroalkyl group having 1 to 3 carbon atoms, and * is a binding site for another portion).

Examples of the fluoroalkyl group having 1 to 3 carbon atoms in the above formula (2) include a fluoromethyl group, a difluoromethyl group, a trifluoromethyl group, a trifluoroethyl group, a pentafluoromethyl group, and a heptafluoropropyl group. Among them, a trifluoromethyl group is preferred.

Examples of the first fluorine-containing monomer having a partial structure represented by the above formula (2) include compounds represented by the following formula (2-a).

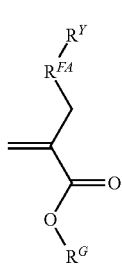

(2-a)

In the above formula (2-a), $R^Y$ is the partial structure represented by the above formula (2), $R^{FA}$ is a single bond or a divalent linking group, and $R^G$ is a hydrogen atom or a monovalent organic group.

Example of the divalent linking group represented by $R^{FA}$ include a divalent chain hydrocarbon group having 1 to 20 carbon atoms, a divalent alicyclic hydrocarbon group having 3 to 20 carbon atoms, and a group obtained by combining at least one of the chain hydrocarbon group and the alicyclic hydrocarbon group and —O—.

Examples of the divalent chain hydrocarbon group having 1 to 20 carbon atoms include a methanediyl group, an ethanediyl group, a propanediyl group, a butanediyl group, a pentanediyl group, a hexanediyl group, an octanediyl group, a decanediyl group, a dodecanediyl group, a tetradecanediyl group, a hexadecanediyl group, an octadecanediyl group, and an icosanediyl group.

Examples of the divalent alicyclic hydrocarbon group having 3 to 20 carbon atoms include a cyclopropanediyl group, a cyclobutanediyl group, a cyclopentanediyl group, a cyclohexanediyl group, a cyclooctanediyl group, and a cyclodecanediyl group.

Examples of the group obtained by combining at least one of the chain hydrocarbon group and the alicyclic hydrocarbon group and —O— include: alkanediyloxy groups such as a methanediyloxy group, an ethanediyloxy group, a propanediyloxy group, a butanediyloxy group, a pentanediyloxy group, a hexanediyloxy group, and an octanediyloxy group; groups containing one —O— such as a methanediyloxymethanediyl group, a methanediyloxyethanediyl group, a methanediyloxy(1,2-propanediyl) group, a methanediyloxybutanediyl group, and a methanediyloxycyclohexanediyl group; and groups containing two or more —O— such as a propanediyloxyethanediyloxyethanediyl group.

Among them, $R^{FA}$ is preferably a single bond, a methanediyl group, an alkanediyloxy group having 2 to 4 carbon atoms, or a cycloalkanediyloxy group having 7 to 10 carbon atoms, more preferably a single bond, a methanediyl group, a 1,2-ethanediyloxy group, a 1,2-propanediyloxy group, or a 2,6-norbornanediyloxy group, even more preferably a 1,2-ethanediyloxy group.

Examples of the monovalent organic group represented by $R^G$ include a monovalent chain hydrocarbon group having 1 to 20 carbon atoms, a monovalent alicyclic hydrocarbon group having 3 to 20 carbon atoms, a monovalent aromatic hydrocarbon group having 6 to 20 carbon atoms, and a group obtained by combining at least one of these groups and a linking group containing a heteroatom, such as —O—, —CO—, —OCO—, —COO—, or —S—. Some or all of the hydrogen atoms contained in these groups may be substituted with a fluorine atom, a hydroxyl group, a carboxyl group, an amino group, a cyano group, or the like.

$R^G$ is preferably a hydrogen atom, a monovalent chain hydrocarbon group, a monovalent alicyclic hydrocarbon group, a monovalent fluorinated chain hydrocarbon group, a monovalent fluorinated alicyclic hydrocarbon group, a monovalent hydroxy chain hydrocarbon group, a group containing a hydroxybis(perfluoroalkyl)methyl group, or a monovalent group having a lactone structure, more preferably a hydrogen atom, a methyl group, an ethyl group, an i-propyl group, a n-butyl group, a cyclohexylmethyl group, a hexafluoro-2-propyl group, a 2-hydroxyethyl group, a hydroxybis(perfluoroalkyl)butyl group, a hydroxybis(perfluoroalkyl)methylnorbornyl group, an α-butyrolacton-yl group, a norbornanelacton-yl group, or a trifluoromethylnorbornanelacton-yl group, even more preferably a methyl group or an ethyl group.

Examples of the first fluorine-containing monomer include compounds represented by the following formulas (2-a-1) to (2-a-14) (hereinafter, also referred to as "compounds (2-a-1) to (2-a-14)").

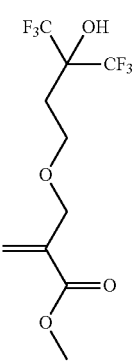

(2-a-1)

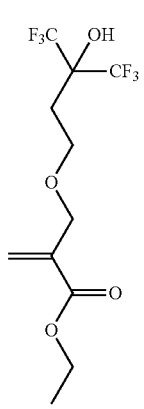
(2-a-2)
(2-a-3)
(2-a-4)
(2-a-5)
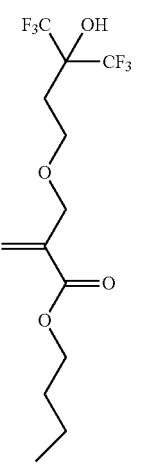
(2-a-6)
(2-a-7)
(2-a-8)

(2-a-9) 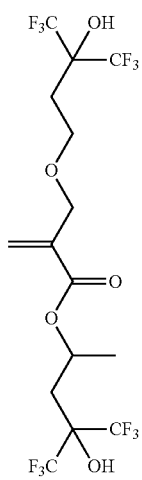

(2-a-10) 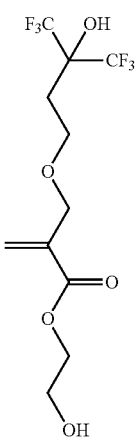

(2-a-11) 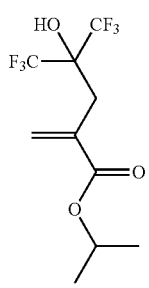

(2-a-12) 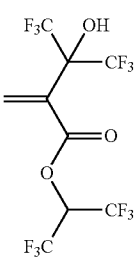

(2-a-13) 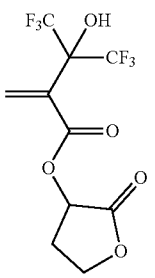

(2-a-14) 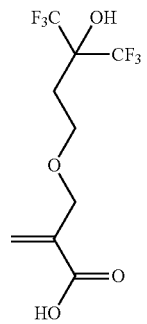

Among them, compounds (2-a-1) to (2-a-9) are preferred, and compounds (2-a-1) to (2-a-3) are more preferred.

The lower limit of the content of the first fluorine-containing monomer in the monomer solution is preferably 10 mol %, more preferably 20 mol %, even more preferably 30 mol %, particularly preferably 35 mol % with respect to the total amount of monomers constituting the monomer solution. The upper limit of the content is preferably 80 mol %, more preferably 70 mol %, even more preferably 60 mol %, particularly preferably 55 mol %.

The first fluorine-containing monomer content within the above range makes it possible to further enhance both the water-repellency and defect preventability of a top coat layer surface.

(Second Fluorine-Containing Monomer)

The monomer solution preferably contains a second fluorine-containing monomer having a partial structure represented by the following formula (3) and having a higher fluorine atom mass content than that of the first fluorine-containing monomer.

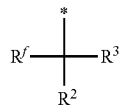

(3)

(wherein $R^f$ is a fluorine atom or a fluoroalkyl group having 1 to 3 carbon atoms, $R^2$ and $R^3$ are each independently a hydrogen atom, a fluorine atom, an alkyl group having 1 to 3 carbon atoms, or a fluoroalkyl group having 1 to 3 carbon atoms, and * is a binding site for another portion).

Examples of the fluoroalkyl group having 1 to 3 carbon atoms in the above formula (3) include a fluoromethyl group, a difluoromethyl group, a trifluoromethyl group, a trifluoroethyl group, a pentafluoromethyl group, and a heptafluoropropyl group. Among them, a trifluoromethyl group is preferred.

Examples of the second fluorine-containing monomer having a partial structure represented by the above formula (3) include compounds represented by the following formula (3-a).

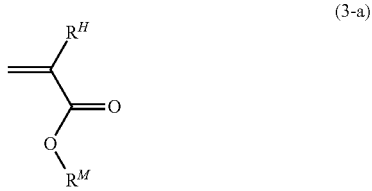

(3-a)

In the above formula (3-a), $R^H$ is a hydrogen atom, a methyl group, a fluorine atom, or a trifluoromethyl group, and $R^M$ is a partial structure represented by the above formula (3).

From the viewpoint of the copolymerizability of the second fluorine-containing monomer, $R^H$ is preferably a hydrogen atom or a methyl group, more preferably a methyl group.

Examples of the second fluorine-containing monomer include compounds represented by the following formulas (3-a-1) to (3-a-4).

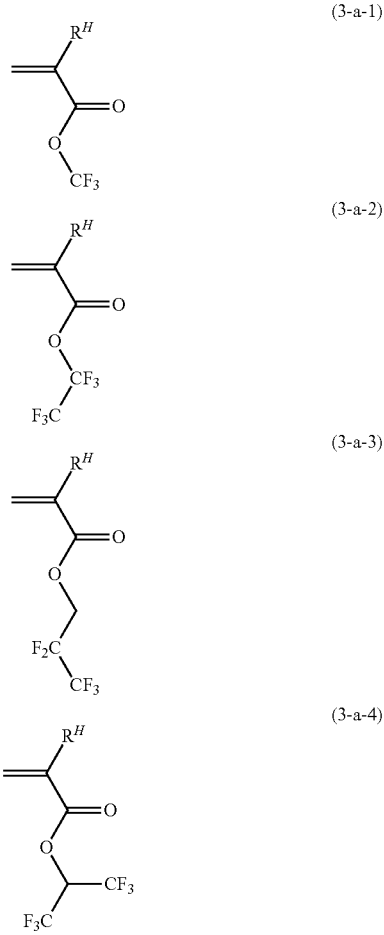

$R^H$ in the above formulas (3-1) to (3-4) is the same as that in the above formula (3-a).

The lower limit of the content of the second fluorine-containing monomer in the monomer solution is preferably 35 mol %, more preferably 40 mol %, even more preferably 45 mol %, particularly preferably 50 mol % with respect to the total amount of monomers constituting the monomer solution. The upper limit of the content is preferably 95 mol %, more preferably 90 mol %, even more preferably 80 mol %, particularly preferably 70 mol %.

The second fluorine-containing monomer content within the above range makes it possible to further enhance the water-repellency of a top coat layer surface.

(Polymerization Solvent)

Examples of the polymerization solvent include an alcohol-based solvent, an ether-based solvent, a ketone-based solvent, an ester-based solvent, and a hydrocarbon-based solvent.

Examples of the alcohol-based solvent include: aliphatic monoalcohols having 1 to 18 carbon atoms, such as 4-methyl-2-pentanol and n-hexanol; alicyclic monoalcohols having 3 to 18 carbon atoms, such as cyclohexanol; polyalcohols having 2 to 18 carbon atoms, such as 1,2-propylene glycol; and partially-etherified polyalcohols having 3 to 19 carbon atoms, such as propylene glycol monomethyl ether.

Examples of the ether-based solvent include: dialkyl ethers having 2 to 14 carbon atoms, such as diethyl ether and dipropyl ether; cyclic ethers such as tetrahydrofuran and tetrahydropyran; and aromatic ring-containing ethers such as diphenyl ether and anisole.

Examples of the ketone-based solvent include: chain ketones having 3 to 12 carbon atoms, such as acetone, methyl ethyl ketone, and methyl-n-butyl ketone; cyclic ketones having 5 to 8 carbon atoms, such as cyclopentanone and cyclohexanone; and 2,4-pentanedione, acetonylacetone, and acetophenone.

Examples of the ester-based solvent include: monocarboxylic esters such as n-butyl acetate and ethyl lactate; polyalcohol carboxylates such as propylene glycol acetate; polyalcohol partially-etherified carboxylates such as propylene glycol monomethyl ether acetate; polycarboxylic diesters such as diethyl oxalate; and carbonates such as dimethyl carbonate and diethyl carbonate.

Examples of the hydrocarbon-based solvent include: aliphatic hydrocarbons having 5 to 12 carbon atoms, such as n-pentane and n-hexane; and aromatic hydrocarbons having 6 to 16 carbon atoms, such as toluene and xylene.

Among them, alcohol-based solvents, ether-based solvents, ketone-based solvents, and ester-based solvents are preferred, and aliphatic monoalcohols, cyclic ethers, and chain or cyclic ketones are more preferred. It is to be noted that the above-mentioned polymerization solvents may be used singly or in combination of two or more of them.

(Polymerization Conditions)

The polymerization is preferably performed in an inert atmosphere such as nitrogen. The reaction temperature of the polymerization is not particularly limited as long as the polymerization initiator cleaves to generate an active species. The lower limit of the reaction temperature is preferably 40° C., more preferably 50° C., even more preferably 60° C. The upper limit of the reaction temperature is preferably 150° C., more preferably 120° C., even more preferably 100° C. The lower limit of the reaction time is preferably 1 hour, more preferably 2 hours. The upper limit of the reaction time is preferably 48 hours, more preferably 24 hours. After the reaction, a known operation such as washing, extraction, filtration, or concentration is appropriately performed to obtain a fluorine-containing resin A containing a structural unit derived from the first fluorine-containing monomer and a structural unit derived from the second fluorine-containing monomer.

(Fluorine-Containing Resin A)

The weight-average molecular weight (Mw) of the fluorine-containing resin A determined by gel permeation chromatography (GPC) using polystyrene standards is preferably 2,000 to 50,000, more preferably 3,000 to 30,000, even more preferably 5,000 to 20,000, particularly preferably 7,000 to 14,000. The Mw of the fluorine-containing resin A equal to or higher than the above lower limit makes it possible to improve the water resistance and mechanical properties of a top coat layer, and the Mw equal to or lower than the above upper limit makes it possible to increase the solubility of the fluorine-containing resin A in the solvent.

The ratio between the Mw and the number-average molecular weight (Mn) determined by GPC using polystyrene standards (Mw/Mn) of the fluorine-containing resin A is preferably 1 to 5, more preferably 1 to 3, even more preferably 1 to 2.5.

The amount of impurities such as halogen ions and metals contained in the composition for resist top coat layer is preferably as small as possible. A reduction in the amount of impurities makes it possible to improve coatability as a top coat layer and homogeneous solubility in an alkaline developer. In order to reduce the amount of impurities, the fluorine-containing resin A may be purified by, for example, one of washing, extraction, adsorption, filtration, and centrifugation or a combination of two or more of them.

<Mixing Step>

In the mixing step, the fluorine-containing resin A and a solvent are mixed to produce a composition for resist top coat layer. If necessary, another resin, an additive, etc. may be added in the mixing step.

(Resin B)

In the mixing step, a resin B different from the fluorine-containing resin A is preferably further added. The fluorine atom mass content of the resin B is preferably lower than that of the fluorine-containing resin A. This makes it possible to easily control the water-repellency of a top coat layer and to improve adhesiveness to a resist film.

The resin B preferably contains a structural unit having a group represented by the following formula (4) (hereinafter, also referred to as a "structural unit (4)").

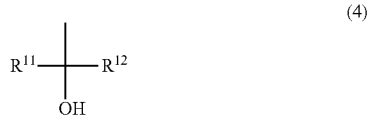

(4)

In the above formula (4), $R^{11}$ is a monovalent fluorinated hydrocarbon group having 1 to 20 carbon atoms, and $R^{12}$ is a hydrogen atom or a monovalent organic group having 1 to 20 carbon atoms.

Examples of the C1 to C20 monovalent fluorinated hydrocarbon group represented by $R^{11}$ include groups obtained by substituting some or all of the hydrogen atoms of a saturated or unsaturated chain hydrocarbon group, a monocyclic or polycyclic alicyclic hydrocarbon group, an aryl group, or an aralkyl group with fluorine atoms. Examples of the polycyclic structure include a condensed ring structure and a cross-linked polycyclic structure such as a norbornane structure, an adamantane structure, or a tricyclodecane structure.

Examples of the monovalent organic group represented by $R^{12}$ include a monovalent hydrocarbon group having 1 to 20 carbon atoms, a monovalent heteroatom-containing group obtained by introducing a heteroatom-containing group between two carbon atoms of the hydrocarbon group, and a monovalent group obtained by substituting some or all of the hydrogen atoms of the hydrocarbon group or the heteroatom-containing group with substituents.

Examples of the monovalent hydrocarbon group include: chain hydrocarbon groups such as alkyl groups (e.g., a methyl group, an ethyl group, a propyl group, and a butyl group), alkenyl groups (e.g., an ethenyl group, a propenyl group, and a butenyl group), and alkynyl groups (e.g., an ethynyl group, a propynyl group, and a butynyl group); alicyclic hydrocarbon groups such as cycloalkyl groups (e.g., a cyclopentyl group, a cyclohexyl group, a norbornyl group, and an adamantyl group) and cycloalkenyl groups (e.g., a cyclopentenyl group and a norbornenyl group); and aromatic hydrocarbon groups such as aryl groups (e.g., a phenyl group, a tolyl group, a xylyl group, a naphthyl group, and an anthryl group) and aralkyl groups (e.g., a benzyl group, a phenethyl group, and a naphthylmethyl group).

The heteroatom in the heteroatom-containing group is not particularly limited as long as it is an atom other than a carbon atom and a hydrogen atom, and examples thereof include an oxygen atom, a nitrogen atom, a silicon atom, a phosphorus atom, and a sulfur atom. Examples of the heteroatom-containing group include —CO—, —COO—, —O—, —NR"—, —CS—, —S—, —SO—, —SO$_2$—, and a group obtained by combining two or more of them.

Examples of the substituents include halogen atoms such as a fluorine atom, a chlorine atom, a bromine atom, and an iodine atom, a hydroxyl group, a carboxyl group, a cyano group, a nitro group, an alkoxy group, an alkoxycarbonyl group, an acyl group, and an acyloxy group.

$R^{12}$ is preferably a hydrogen atom, a monovalent hydrocarbon group, a monovalent fluorinated hydrocarbon group, or a group having a hydroxyl group, more preferably a hydrogen atom, an alkyl group, a fluorinated alkyl group, or a group having a hydroxyl group and a fluorine atom, even more preferably a hydrogen atom, an alkyl group having 1 to 6 carbon atoms, a fluorinated alkyl group having 1 to 6 carbon atoms, or a group having 1 to 6 carbon atoms and containing a di(trifluoromethyl)hydroxymethyl group, particularly preferably a hydrogen atom, a methyl group, an ethyl group, a 1,1,1-trifluoromethyl group, a 2,2,2-trifluoroethyl group, or a 2-hydroxy-2-trifluoromethyl-1,1,1-trifluoro-4-butyl group.

Examples of the structural unit (4) include structural units represented by the following formula (4-1) (hereinafter, also referred to as "structural units (4-1)").

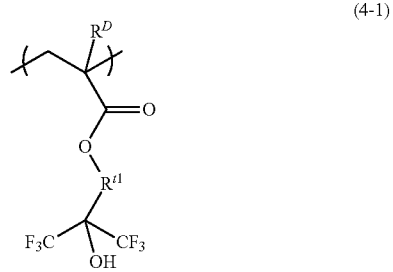

(4-1)

In the above formula (4-1), $R^D$ is a hydrogen atom, a fluorine atom, a methyl group, or a trifluoromethyl group, and $R^{t1}$ is a divalent linking group.

From the viewpoint of the copolymerizability of a monomer that gives the structural unit (4-1), $R^D$ is preferably a hydrogen atom or a methyl group, more preferably a methyl group.

Examples of the divalent group represented by $R^{r1}$ include a divalent chain hydrocarbon group having 1 to 6 carbon atoms, a divalent alicyclic hydrocarbon group having 4 to 12 carbon atoms, and a group obtained by introducing —O—, —CO— or —COO— between two carbon atoms of each of these groups.

Examples of the divalent chain hydrocarbon group having 1 to 6 carbon atoms include groups obtained by removing two hydrogen atoms from saturated or unsaturated chain hydrocarbons.

Examples of the divalent alicyclic hydrocarbon group having 4 to 12 carbon atoms include groups obtained by removing two hydrogen atoms from monocyclic or polycyclic alicyclic hydrocarbons.

Among them, $R^{r1}$ is preferably a divalent chain hydrocarbon group having 1 to 3 carbon atoms or a divalent alicyclic hydrocarbon group having 4 to 12 carbon atoms, more preferably a propanediyl group, a divalent group containing a cyclohexane skeleton, a divalent group containing a norbornane skeleton, a divalent group containing a tetracyclododecane skeleton, or a divalent group containing an adamantane skeleton, even more preferably a 1,2-propanediyl group or a 1-cyclohexyl-1,2-ethanediyl group.

Examples of the structural unit (4-1) include structural units represented by the following formulas (4-1-1) to (4-1-8) (hereinafter, also referred to as "structural units (4-1-1) to (4-1-8)").

(4-1-1)
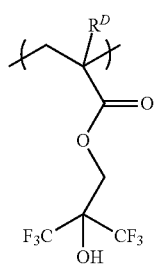

(4-1-2)
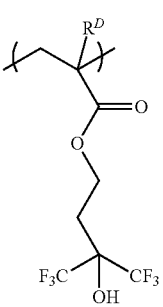

(4-1-3)
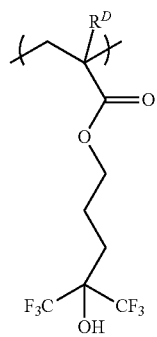

(4-1-4)
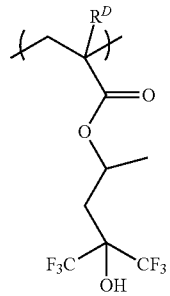

(4-1-5)
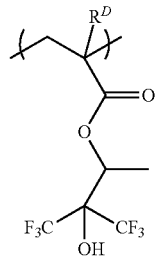

(4-1-6)
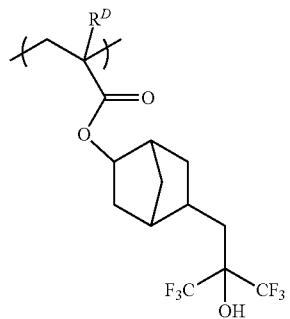

(4-1-7)
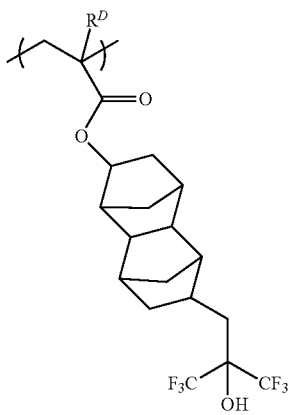

(4-1-8)

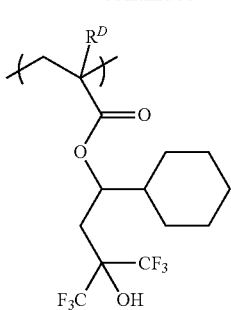

$R^D$ in the above formulas (4-1-1) to (4-1-8) is the same as that in the above formula (4-1).

Among them, structural units (4-1-4) and (4-1-8) are preferred.

The resin B may contain one kind of structural unit (4) or two or more kinds of structural units (4) in combination. The resin B may contain a structural unit derived from a monomer constituting the fluorine-containing resin A as long as the fluorine atom mass content of the resin B is lower than that of the fluorine-containing resin A.

The lower limit of the content of the structural unit (4) in the resin B is preferably 50 mol %, more preferably 60 mol %, even more preferably 70 mol %, particularly preferably 80 mol % with respect to the total amount of structural units constituting the resin B. The upper limit of the content is preferably 100 mol %, more preferably 98 mol %, even more preferably 95 mol %, particularly preferably 90 mol % with respect to the total amount of structural units constituting the resin B. The structural unit (4) content of the resin B within the above range makes it possible to further improve the balance between the water-repellency of a top coat layer formed from the composition for resist top coat layer and the removability of the top coat layer.

(Resin C)

In the mixing step, a resin C is preferably further added. The resin C is different from the fluorine-containing resin A and the resin B, and has at least one selected from the group consisting of a sulfo group and a carboxyl group. Due to the action of a (strong) acidic group introduced into the resin C forming a top coat layer, solubility of a layer, which is formed by intermingling of a resist film and the top coat layer near the interface between the both layers, in a developer is improved so that residue defects can be prevented.

(Sulfo Group-Containing Structural Unit)

The resin C preferably contains a structural unit having a sulfo group. The sulfo group-containing structural unit is preferably represented by the following formula (5) (hereinafter, the structural unit represented by the following formula (5) is also referred to as a "structural unit (5)").

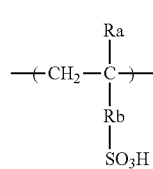

(5)

(in the formula (5), Ra is a hydrogen atom or a methyl group, and Rb is a single bond, an oxygen atom, a sulfur atom, or a divalent organic group).

A hydrogen atom is preferable as Ra in view of copolymerizability and acidity.

The divalent organic group represented by Rb is preferably a divalent chain hydrocarbon group having 1 to 6 carbon atoms, a divalent alicyclic hydrocarbon group having 4 to 12 carbon atoms, a divalent aromatic hydrocarbon group having 6 to 12 carbon atoms, or —C(=O)—X'—R'— group. Here, X' is an oxygen atom, a sulfur atom, or an NH group. R' is a single bond, a divalent chain hydrocarbon group having 1 to 6 carbon atoms, a divalent alicyclic hydrocarbon group having 4 to 12 carbon atoms, or a divalent aromatic hydrocarbon group having 6 to 12 carbon atoms.

Examples of the divalent chain hydrocarbon group having 1 to 6 carbon atoms represented by the above Rb and R' include alkanediyl groups such as methanediyl group, ethanediyl group, and propanediyl group; alkenediyl groups such as ethenediyl group, propenediyl group, and butenediyl group; and alkynediyl groups such as ethynediyl group, propynediyl group, and butynediyl group.

Examples of the divalent alicyclic hydrocarbon group having 4 to 12 carbon atoms represented by the above Rb and R' include monocyclic cycloalkanediyl groups such as cyclopentanediyl group, cyclohexanediyl group, and cyclooctanediyl group; monocyclic cycloalkenediyl groups such as cyclopentenediyl group, cyclohexenediyl group, and cyclooctenediyl group; polycyclic cycloalkanediyl groups such as norbornanediyl group and adamantanediyl group; and polycyclic cycloalkenediyl groups such as norbornenediyl group and tricyclodecenyl group.

Examples of the divalent aromatic hydrocarbon group having 6 to 12 carbon atoms represented by the above Rb and R' include phenylene group, tolylene group, and naphthylene group.

The above Rb is preferably a single bond, a divalent chain hydrocarbon group having 1 to 6 carbon atoms, a divalent aromatic hydrocarbon group having 6 to 12 carbon atoms, or —C(=O)—NH—R'— group in which R' is a divalent chain hydrocarbon group having 1 to 6 carbon atoms, more preferably a single bond, methanediyl group, phenylene group, or —C(=O)—NH—CH(CH$_3$)—CH$_2$—, still more preferably a single bond or —C(=O)—NH—CH(CH$_3$)—CH$_2$—.

Examples of the sulfo group-containing structural unit include structural units represented by the following formulas (5-1) to (5-4) (hereinafter, also referred to as "structural units (5-1) to (5-4)").

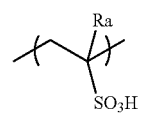

(5-1)

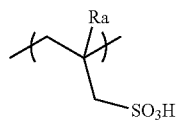

(5-2)

(5-3)

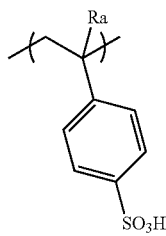

(5-4)

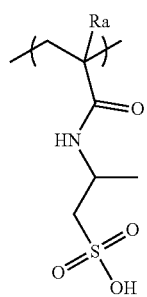

Ra in the above formulas (5-1) to (5-4) is the same as that in the above formula (5). Among them, a structural unit (5-1) is preferred.

The resin C may contain one kind of structural unit (5) or two or more kinds of structural units (5) in combination.

The lower limit of the content of the structural unit (5) (when two or more kinds of structural units (5) are contained, the total content of the structural units (5)) in the resin C is preferably 0.5 mol %, more preferably 1 mol %, even more preferably 1.5 mol % with respect to the total amount of structural units constituting the resin C. The upper limit of the content is preferably 20 mol %, more preferably 15 mol %, even more preferably 12 mol % with respect to the total amount of structural units constituting the resin C. The structural unit (5) content of the resin A within the above range makes it possible to improve control of the acidity of the resin C, local distribution of the resin C on the resist film side, and removability of a top coat layer with a developer.

(Carboxyl Group-Containing Structural Unit)

The resin C preferably contains a carboxyl group-containing structural unit instead of or in addition to the above-described sulfo group-containing structural unit. When the resin C has such an acidic group, it is possible to improve control of the acidity of the resin C, local distribution of the resin C on the resist film side, and removability of a top coat layer with a developer.

The carboxyl group-containing structural unit is preferably represented by the following formula (6) (hereinafter, the structural unit represented by the following formula (6) is also referred to as a "structural unit (6)").

(6)

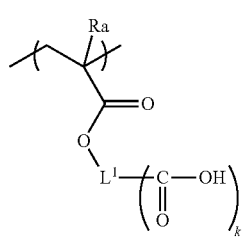

In the above formula (6), $R^E$ is a hydrogen atom, a fluorine atom, a methyl group, or a trifluoromethyl group. Here, k is an integer of 0 to 3. When k is 1 to 3, $L^1$ is a (k+1)-valent linking group. When k is 0, $L^1$ is a hydrogen atom.

The above $R^E$ is preferably a hydrogen atom or a methyl group, more preferably a methyl group, in view of copolymerizability of the monomers giving the carboxyl group-containing structural unit and the like.

Examples of the (k+1)-valent linking group represented by the above L' include an alkanediyl group, a cycloalkanediyl group, an alkenediyl group, and an arenediyl group as the divalent linking groups (when k and m are 1). Here, a part or whole of the hydrogen atoms that these groups have may be substituted with halogen atoms such as a fluorine atom or a chlorine atom, a cyano group, or the like.

Examples of the above alkanediyl group include methanediyl group, ethanediyl group, propanediyl group, butanediyl group, hexanediyl group, and octanediyl group. The above alkanediyl group is preferably an alkanediyl group having 1 to 8 carbon atoms.

Examples of the above cycloalkanediyl group include monocyclic cycloalkanediyl groups such as cyclopentanediyl group and cyclohexanediyl group; and polycyclic cycloalkanediyl groups such as norbornanediyl group and adamantanediyl group. The above cycloalkanediyl group is preferably a cycloalkanediyl group having 5 to 12 carbon atoms.

Examples of the above alkenediyl group include ethenediyl group, propenediyl group, and butenediyl group. The above alkenediyl group is preferably an alkenediyl group having 2 to 6 carbon atoms.

Examples of the above arenediyl group include phenylene group, tolylene group, and naphthylene group. The above arenediyl group is preferably an arenediyl group having 6 to 15 carbon atoms.

Among these, L' is preferably an alkanediyl group or a cycloalkanediyl group, and more preferably is an alkanediyl group having 1 to 4 carbon atoms or a cycloalkanediyl group having 6 to 11 carbon atoms. When L' is a cycloalkanediyl group, it is preferable in view of enhancing the water repellency of the resist top coat layer formed from the resist top coat layer forming resin composition.

The above k is preferably an integer of 0 to 2, more preferably 0 or 1, and still more preferably 0.

Examples of the carboxyl group-containing structural unit include structural units represented by the following formulas (6-1) to (6-3) (hereinafter, also referred to as "structural units (6-1) to (6-3)").

(6-1)

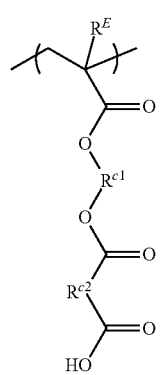

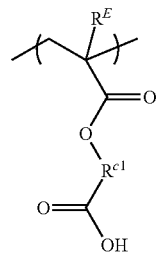
(6-2)

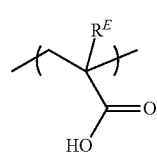
(6-3)

$R^E$ in the above formulas (6-1) to (6-3) is the same as that in the above formula (6). In the above formulas (6-1) and (6-2), $R^{C1}$ and $R^{C2}$ are each independently a divalent chain hydrocarbon group having 1 to 6 carbon atoms, a divalent alicyclic hydrocarbon group having 4 to 12 carbon atoms, or a divalent aromatic hydrocarbon group having 6 to 12 carbon atoms.

Examples of the divalent chain hydrocarbon group having 1 to 6 carbon atoms represented by the above $R^{c1}$ and $R^{c2}$ include alkanediyl groups such as methanediyl group, ethanediyl group, propanediyl group, butanediyl group, hexanediyl group, and octanediyl group; alkenediyl groups such as ethenediyl group, propenediyl group, and butenediyl group; and alkynediyl groups such as ethynediyl group.

Examples of the divalent alicyclic hydrocarbon group having 4 to 12 carbon atoms represented by the above $R^{c1}$ and $R^{c2}$ include monocyclic cycloalkanediyl groups such as cyclopentanediyl group and cyclohexanediyl group; polycyclic cycloalkanediyl groups such as norbornanediyl group and adamantanediyl group; monocyclic cycloalkenediyl groups such as cyclopentenediyl group; and polycyclic cycloalkenediyl groups such as norbornenediyl group.

Among these, a saturated chain hydrocarbon group and a monocyclic hydrocarbon group are preferable, and 1,2-ethanediyl group and 1,2-cyclohexanediyl group are more preferable.

Examples of the divalent aromatic hydrocarbon group having 6 to 12 carbon atoms represented by the above $R^{c1}$ and $R^{c2}$ include groups similar to those exemplified as Rb in the above formula (1).

Examples of the structural unit (6-1) and the structural unit (6-2) include structural units represented by the following formulas (6-1-1) to (6-1-5) (hereinafter, also referred to as "structural units (6-1-1) to (6-1-5)").

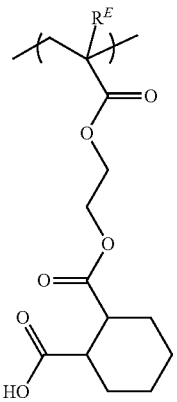
(6-1-1)

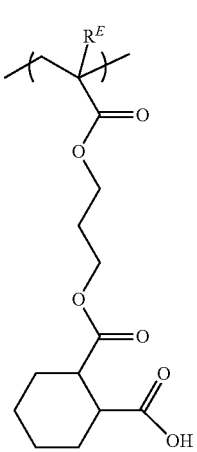
(6-1-2)

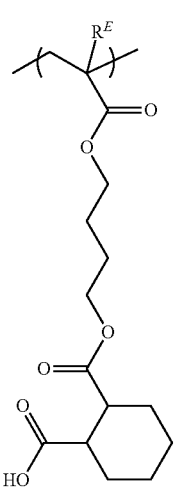
(6-1-3)

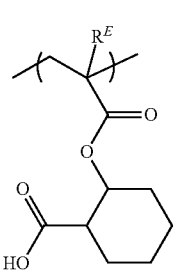
(6-1-4)

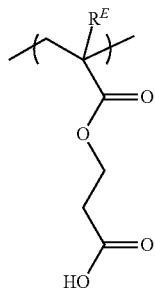

(6-1-5)

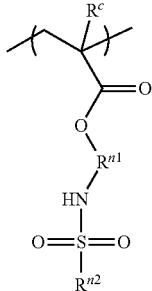

(7-1)

$R^E$ in the above formulas (6-1-1) to (6-1-5) is the same as that in the above formula (6).

Among the structural units (6-1) to (6-3), the structural unit (6-1) and the structural unit (6-3) are preferred. Among the structural units (6-1), the structural unit (6-1-1) is preferred.

The resin C may contain one kind of structural unit (6) or two or more kinds of structural units (6) in combination.

The lower limit of the content of the structural unit (6) (when two or more kinds of structural units (6) are contained, the total content of the structural units (6)) in the resin C is preferably 80 mol %, more preferably 82 mol %, even more preferably 85 mol % with respect to the total amount of structural units constituting the resin C. The upper limit of the content is preferably 99.5 mol %, more preferably 99 mol %, even more preferably 98.5 mol % with respect to the total amount of structural units constituting the resin C. The structural unit (6) content of the resin C within the above range makes it possible to improve control of the acidity of the resin C, local distribution of the resin C on the resist film side, and removability of a top coat layer with a developer.

(Fluorinated Sulfonamide Group-Containing Structural Unit)

The resin C may contain a structural unit having a group represented by the following formula (7) (fluorinated sulfonamide group) (hereinafter, the structural unit having a group represented by the following formula (7) is also referred to as a "structural unit (7)").

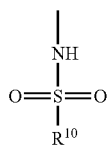

(7)

In the above formula (7), $R^{10}$ is a monovalent fluorinated hydrocarbon group having 1 to 20 carbon atoms.

Preferred examples of the C1 to C20 monovalent fluorinated hydrocarbon group represented by $R^{10}$ include C1 to C20 monovalent fluorinated hydrocarbon groups represented by $R^{11}$ in the above formula (4).

Examples of the structural unit (7) include structural units represented by the following formula (7-1) (hereinafter, also referred to as "structural units (7-1)").

In the above formula (7-1), $R^C$ is a hydrogen atom, a methyl group, a fluorine atom, or a trifluoromethyl group. $R^{n1}$ is a divalent linking group. $R^{n2}$ is a fluorinated alkyl group having 1 to 20 carbon atoms.

The above $R^C$ is preferably a hydrogen atom or a methyl group, more preferably a methyl group, in view of copolymerizability of the monomers giving the structural unit (7-1) and the like.

Examples of the above divalent linking group represented by $R^{n1}$ include a divalent chain hydrocarbon group having 1 to 6 carbon atoms, a divalent alicyclic hydrocarbon group having 4 to 12 carbon atoms, and a group containing —O—, —CO—, or —COO— between carbon-carbon of these groups.

Examples of the above divalent chain hydrocarbon group having 1 to 6 carbon atoms include a group in which two of the hydrogen atoms contained in saturated or unsaturated chain hydrocarbon groups have been removed.

Examples of the above divalent alicyclic hydrocarbon group having 4 to 12 carbon atoms include a group in which two of the hydrogen atoms contained in monocyclic or polycyclic alicyclic hydrocarbon groups have been removed.

Among these, $R^{n1}$ is preferably a divalent chain hydrocarbon group having 1 to 3 carbon atoms, more preferably an alkanediyl group having 1 to 3 carbon atoms, and more preferably 1,2-ethanediyl group.

Examples of the above fluorinated alkyl group having 1 to 20 carbon atoms represented by $R^{n2}$ include fluoromethyl group, difluoromethyl group, trifluoromethyl group, trifluoroethyl group, pentafluoromethyl group, heptafluoropropyl group, and nonafluorobutyl group. Among these, trifluoromethyl group is preferable.

(Another Structural Unit in Resin C)

The resin C may have another structural unit other than the structural units (5) and (6). From the viewpoint of improving water-repellency, examples of another structural unit include structural units derived from alkyl (meth)acrylates such as methyl (meth)acrylate, ethyl (meth)acrylate, propyl (meth)acrylate, butyl (meth)acrylate, and lauryl (meth)acrylate. From the viewpoint of controlling the molecular weight, glass transition point, and solubility in a solvent of the resin C, examples of another structural unit include structural units having an acid-dissociable group. In this description, the term "acid-dissociable group" refers to a group that substitutes for a hydrogen atom of a carboxyl group and is dissociated due to the action of an acid. Further, a structural unit constituting the resin A or the resin B may be contained.

The resin C may not contain another structural unit. When the resin C contains another structural unit, the lower limit of the content of the anther structural unit in the resin C is preferably 5 mol %, more preferably 10 mol %, even more preferably 15 mol % with respect to the total amount of structural units constituting the resin C. On the other hand, the upper limit of the content is preferably 90 mol % or less, more preferably 80 mol % or less, even more preferably 70 mol % or less.

(Composition of Resin C)

The sulfo group-containing structural unit content and the carboxyl group-containing structural unit content of the resin C may be adjusted to use a strongly acidic resin having a relatively high sulfo group-containing structural unit content, or to use an acidic resin having an acidity lower than that of the strongly acidic resin obtained by relatively reducing the sulfo group-containing structural unit content, or to use the strongly acidic resin and the acidic resin in combination.

(Method for Synthesizing Resin B and Resin C)

Similar to the fluorine-containing resin A, the resin B and the resin C can be synthesized by, for example, polymerizing a predetermined monomer by radical polymerization or the like in a polymerization solvent in the presence of an appropriately-selected polymerization initiator or chain transfer agent. The polymerization solvent and polymerization conditions are the same as those described with reference to the fluorine-containing resin A.

(Solvent)

The solvent to be mixed with the resin A in the mixing step is not particularly limited as long as the solvent can dissolve or disperse each resin component and an additive added if necessary. Particularly, a solvent can suitably be used which hardly causes a reduction in lithography performance due to the occurrence of excessive intermixing with a resist film when the composition for resist top coat layer is applied onto the resist film.

Examples of the solvent include alcohol-based solvents, ether-based solvents, hydrocarbon-based solvents, ketone-based solvents, ester-based solvents, and water.

Examples of the alcohol-based solvents include monohydric alcohols such as butanol and pentanol; polyhydric alcohols such as ethylene glycol and propylene glycol; and partial alkyl ethers of polyhydric alcohol such as ethylene glycol monomethyl ether and ethylene glycol monoethyl ether.

Examples of the ether-based solvents include alkyl ethers of polyhydric alcohol such as ethylene glycol dimethyl ether, ethylene glycol methyl ethyl ether, ethylene glycol diethyl ether, and diethylene glycol dimethyl ether; aliphatic ethers such as diethyl ether, dipropyl ether, dibutyl ether, butyl methyl ether, butyl ethyl ether, diisoamyl ether, hexyl methyl ether, octyl methyl ether, cyclopentyl methyl ether, and dicyclopentyl ether; aliphatic-aromatic ethers such as anisole and phenyl ethyl ether; and cyclic ethers such as tetrahydrofuran, tetrahydropyran, and dioxane.

Examples of the hydrocarbon-based solvents include lower hydrocarbons such as hexane, cyclohexane, and heptane; and higher hydrocarbons such as decane, dodecene, and undecane.

Examples of the ketone-based solvents include dialkyl ketones such as acetone and methyl ethyl ketone; and cyclic ketones such as cyclopentanone and cyclohexanone.

Examples of the ester-based solvents include alkyl ether acetates of polyhydric alcohol such as ethylene glycol monomethyl ether acetate, ethylene glycol monoethyl ether acetate, diethylene glycol monomethyl ether acetate, and diethylene glycol monoethyl ether acetate; and aliphatic acid esters such as ethyl acetate and butyl acetate.

Among these, alcohol-based solvents, ether-based solvents, and ester-based solvents are preferable. As the alcohol-based solvents, monohydric alcohols and partial alkyl ethers of polyhydric alcohol are preferable. As the ether-based solvents, aliphatic ethers, cyclic ethers, and alkyl ethers of polyhydric alcohol are preferable. As the ester-based solvents, alkyl ether acetates of polyhydric alcohol are preferable.

The solvent is preferably at least one selected from the group consisting of a monovalent aliphatic alcohol having 3 to 8 carbon atoms, a dialkyl ether having 6 to 12 carbon atoms, a monoalkyl ether of a monoalkylene glycol having 2 to 4 carbon atoms, a monoalkyl ether monocarboxylate of a monoalkylene glycol having 2 to 4 carbon atoms, a monoalkyl ether of a dialkylene glycol having 4 to 8 carbon atoms, and a monoalkyl ether monocarboxylate of a dialkylene glycol having 4 to 8 carbon atoms.

Further, the solvent preferably contains at least one selected from the group consisting of a monovalent aliphatic alcohol having 3 to 8 carbon atoms and a dialkyl ether having 6 to 12 carbon atoms and at least one selected from the group consisting of a monoalkyl ether of a monoalkylene glycol having 2 to 4 carbon atoms and a monoalkyl ether of a dialkylene glycol having 4 to 8 carbon atoms. 4-methyl-2-pentanol, diisoamyl ether, and diisopropylene glycol monomethyl ether are particularly preferred. The solvent preferably contains an ether-based solvent, which makes it possible to reduce the viscosity of the composition for top coat layer and to effectively reduce the amount of the composition to be applied, thereby reducing costs.

(Additive)

The composition for resist top coat layer may contain an additive in addition to each resin component and a solvent. Examples of the additive include surfactants.

Examples of the surfactants include commercially available fluorine-based surfactants such as BM-1000 and BM-1100 (these two are manufactured by BM Chemie), and MEGAFAC F142D, MEGAFAC F172, MEGAFAC F173, and MEGAFAC F183 (these four are manufactured by DIC Corporation). The content of the aforementioned surfactants is preferably 5 parts by mass or less relative to 100 parts by mass of the resin components.

(Composition for Resist Top Coat Layer)

As described above, the composition for resist top coat layer can be prepared by mixing each resin component and an additive, added if necessary, with a solvent. The solid component concentration of the composition for resist top coat layer is usually 0.5 mass % to 30 mass %, preferably 1 mass % to 20 mass %.

The lower limit of the content of the fluorine-containing resin A in the total mass of resin solid components of the composition for resist top coat layer is preferably 2 mass %, more preferably 4 mass %, even more preferably 6 mass %. The upper limit of the content of the fluorine-containing resin A is preferably 40 mass %, more preferably 35 mass %, even more preferably 30 mass %. The fluorine-containing resin A content within the above range makes it possible to exhibit water-repellency at a higher level.

When the composition for resist top coat layer contains the resin B, the lower limit of the content of the resin B in the total mass of resin solid components is preferably 20 mass %, more preferably 25 mass %, even more preferably 30 mass %. The upper limit of the content of the fluorine-containing resin B is preferably 90 mass %, more preferably 80 mass %, even more preferably 70 mass %. The resin B content within the above range makes it possible to achieve both the water-repellency and adhesiveness of a top coat layer at a higher level.

When the composition for resist top coat layer contains the resin C, the lower limit of the content of the resin C (when a strongly acidic resin and an acidic resin are used in combination, the total content of these resins) in the total mass of resin solid components is preferably 10 mass %, more preferably 15 mass %, even more preferably 20 mass %. The upper limit of the content of the resin C is preferably 60 mass %, more preferably 50 mass %, even more preferably 40 mass %. The content of the resin C within the above range makes it possible to improve solubility in a developer.

<<Method for Forming Resist Pattern>>

A method for forming a resist pattern according to this embodiment includes:

(1) polymerizing a monomer solution containing at least a fluorine-containing monomer in the presence of a polymerization initiator that cleaves to generate an active species containing 7 or more carbon atoms in total to obtain a fluorine-containing resin A;

(2) mixing the fluorine-containing resin A and a solvent to prepare a composition for resist top coat layer;

(3) applying the composition for resist top coat layer onto a resist film to form a liquid immersion top coat layer;

(4) subjecting the resist film having the liquid immersion top coat layer formed thereon to liquid immersion lithography; and (5) developing the resist film subjected to liquid immersion lithography.

The method for forming a resist pattern uses the composition for resist top coat layer, which makes it possible to form a resist top coat layer (especially, a liquid immersion top coat layer) having high water-repellency and excellent solubility in a developer.

Hereinbelow, each of the steps will be described.

(Step (1) and Step (2))

As the step (1) and the step (2), the polymerization step and the mixing step in the method for producing a composition for resist top coat layer can suitably be employed.

(Step (3))

In the step (3), the composition for resist top coat layer is applied onto a resist film to form a liquid immersion top coat layer. Examples of a method for applying the composition for resist top coat layer include conventionally-known coating methods such as spin coating, cast coating, and roll coating. In this step, prebaking (PB) is preferably performed after the composition for resist top coat layer is applied. Formation of a liquid immersion top coat layer on a resist film in such a way prevents direct contact between the resist film and a liquid immersion medium, which effectively prevents reduction in the lithography performance of the resist film caused by penetration of the liquid immersion medium into the resist film and contamination of the lens of a projection exposure apparatus with components eluted from the resist film into the liquid immersion medium.

The thickness of the liquid immersion top coat layer formed is preferably close to an odd multiple of $\lambda/4$ m (wherein $\lambda$ represents the wavelength of radiation, m represents the refractive index of the top coat layer) as much as possible. This makes it possible to enhance the effect of preventing reflection on the upper interface of the resist film.

A photoresist composition is applied onto a substrate so as to form a resist film. As the substrate, typically, a silicon wafer, a silicon wafer covered with aluminum, or the like is used. Also, in order to draw out the characteristics of the resist film to the maximum extent, it is also preferable to form an organic or inorganic reflection preventive film, which is disclosed, for example, in JP-B-06-12452, on a surface of the substrate in advance.

The type of the photoresist composition is not particularly limited, and a suitable one may be selected and used from among the photoresist compositions that are conventionally used for forming a resist film, in accordance with the purpose of use of the resist. Among these, a photoresist composition containing a resin P having an acid-dissociative group and an acid generating agent Q is preferable.

In the resin P, a structural unit having an acid-dissociative group (hereinafter also referred to as "structural unit (p)") may be, for example, a structural unit represented by the following formula (8).

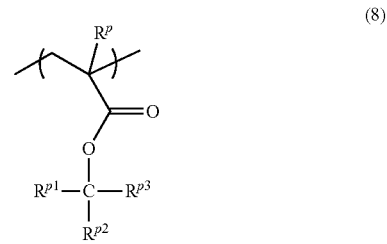

(8)

In the formula (8), $R^p$ is a hydrogen atom, a fluorine atom, a methyl group, or a trifluoromethyl group. $R^{p1}$ is a monovalent chain hydrocarbon group having 1 to 10 carbon atoms. $R^{p2}$ and $R^{p3}$ each represent a monovalent chain hydrocarbon group having 1 to 10 carbon atoms, a monovalent alicyclic hydrocarbon group having 3 to 20 carbon atoms, or a ring structure formed by bonding of these groups with each other and having 3 to 20 carbon atoms.

The above $R^p$ is preferably a hydrogen atom or a methyl group, more preferably a methyl group, in view of copolymerizability of the monomers giving the structural units (p) and the like.

Examples of the monovalent chain hydrocarbon group having 1 to 10 carbon atoms represented by the above $R^{p1}$, $R^{p2}$, and $R^{p3}$ include alkyl groups such as methyl group, ethyl group, n-propyl group, i-butyl group, and n-butyl group.

Examples of the monovalent alicyclic hydrocarbon group having 3 to 20 carbon atoms represented by the above $R^{p2}$ and $R^{p3}$ include monocyclic cycloalkyl groups such as cyclobutyl group, cyclopentyl group, and cyclohexyl group; and polycyclic cycloalkyl groups such as norbornyl group and adamantyl group.

Examples of the above ring structure formed by bonding of these groups with each other and having 3 to 20 carbon atoms include monocyclic cycloalkane structures such as a cyclopentane structure and a cyclohexane structure; and polycyclic cycloalkane structures such as a norbornane structure and an adamantane structure.

Examples of the structural unit (p) include structural units derived from 1-alkyl-1-monocyclic cycloalkyl (meth)acrylates such as 1-ethyl-1-cyclopentyl (meth)acrylate; and 2-alkyl-2-polycyclic cycloalkyl (meth)acrylates such as 2-i-propyl-2-adamantyl (meth)acrylate.

Besides the structural unit (p), the resin P preferably further has a structural unit (which may hereafter be also referred to as "structural unit (q)") containing at least one kind selected from the group consisting of a lactone structure, a cyclic carbonate structure, and a sultone structure.

Examples of the structural unit (q) include structural units derived from (meth)acrylic acid esters including a norbornane lactone structure, a butyrolactone structure, and others as the lactone structure; an ethylene carbonate structure, a propylene carbonate structure, and others as the cyclic carbonate structure; and a norbornane sultone structure and a propane sultone structure as the sultone structure.

Also, the resin P may contain other structural units other than the structural unit (p) and the structural unit (q). Examples of the other structural units include a structural unit containing a hydrocarbon group having 4 or more and 20 or less carbon atoms and a structural unit containing a polar group such as a hydroxyl group.

The content of the structural unit (p) is preferably 30 mol % to 60 mol % relative to the total structural units constituting the resin P. By setting the content of structural unit (p) to be within the aforementioned range, the resolution of the photoresist composition can be improved. When the content of structural unit (p) is less than the above lower limit, the pattern formability of the photoresist composition may deteriorate. When the content of structural unit (p) exceeds the above upper limit, the adhesion of the formed resist film to the substrate may decrease.

The content of the structural unit (q) is preferably 20 mol % to 60 mol % relative to the total structural units constituting the resin P. By setting the content of structural unit (q) to be within the aforementioned range, the solubility of the resist film formed from the photoresist composition to the development liquid can be suitably adjusted, and the adhesion of the resist film to the substrate can be improved. When the content of structural unit (q) is less than the above lower limit, the adhesion of the photoresist composition to the substrate may decrease. When the content of structural unit (q) exceeds the above upper limit, the pattern formability of the photoresist composition may deteriorate.

The content of the aforementioned other structural units is preferably 20 mol % or less, more preferably 15 mol % or less, relative to the total structural units constituting the resin P.

The aforementioned acid generating agent Q is a substance that generates an acid by radiation (exposure). By action of this generated acid, the acid-dissociative group that has protected the carboxyl group and the like of the resin P is dissociated at the exposed part, thereby generating a carboxyl group and the like. As a result of this, the solubility of the resin P to the development liquid changes at the exposed part, whereby the resist pattern is formed.

Examples of the acid generating agent Q include onium salts such as sulfonium salt, tetrahydrothiophenium salt, iodonium salt, phosphonium salt, diazonium salt, and pyridinium salt, N-sulfonyloxyimide compounds, halogen-containing compounds, and diazoketone compounds.

Examples of the sulfonium salt include triphenylsulfonium nonafluoro-n-butanesulfonate, 4-cyclohexylphenyldiphenylsulfonium nonafluoro-n-butanesulfonate, triphenylsulfonium 2-(bicyclo[2.2.1]hepta-2'-yl)-1,1,2,2-tetrafluoroethanesulfonate, and triphenylsulfonium 2-(bicyclo[2.2.1]hepta-2'-yl)-1,1-difluoroethanesulfonate.

Examples of the tetrahydrothiophenium salt include 1-(4-n-butoxynaphthalene-1-yl)tetrahydrothiophenium nonafluoro-n-butanesulfonate and 1-(4-n-butoxynaphthyl)tetrahydrothiophenium 2-(bicyclo[2.2.1]hepta-2'-yl)-1,1,2,2-tetrafluoroethanesulfonate.

The photoresist composition may contain other components such as an acid diffusion controlling agent R, a resin S containing a fluorine atom in a larger amount per unit mass than in the resin P (fluorine-atom-containing polymer), and a surfactant besides the resin P and the acid generating agent Q. Examples of the acid diffusion controlling agent R include amine compounds such as trioctylamine and triethanolamine; N-t-alkoxycarbonyl-containing amide compounds such as R-(+)-(t-butoxycarbonyl)-2-piperidinemethanol and N-t-butoxycarbonyl-4-hydroxypiperidine; and photodegradable bases such as triphenylsulfonium 10-camphorsulfonate and triphenylsulfonium salicylate.

The resin S which is a fluorine-atom-containing polymer is a resin containing a fluorine atom in a larger amount per unit mass than in the resin P. The resin S contains a fluorine atom in a larger amount per unit mass than in the resin P, so that, owing to the oil-repellent characteristic thereof, the fluorine-atom-containing polymer is liable to be locally distributed in the resist film surface layer when the resist film is formed. As a result of this, the components in the resist film can be prevented from migrating into the top coat layer. Also, use of a resin having a later-described alkali-dissociative group as the resin S can enhance the solubility to the development liquid and can contribute to the suppression of the residue defects.

A lower limit of the amount of fluorine atoms contained per unit mass in the resin S is preferably 1 mass %, more preferably 2 mass %, and still more preferably 3 mass %. An upper limit of the amount of fluorine atoms contained per unit mass in the resin S is preferably 60 mass %, more preferably 50 mass %, and still more preferably 40 mass %. By setting the amount of fluorine atoms contained per unit mass in the resin S to be within the aforementioned range, the local distribution of the resin S in the resist film can be adjusted more suitably. Here, the amount of fluorine atoms contained per unit mass in the resin can be determined by determining the structure of the resin through $^{13}$C-NMR spectrum measurement and making calculations from the structure.

The form by which the fluorine atoms are contained in the resin S is not particularly limited, so that the fluorine atoms may be bonded to any of the main chain, side chain, and terminal end; however, the resin S preferably has a structural unit containing a fluorine atom (which may hereafter be also referred to as "structural unit (f)"). Besides the structural unit (f), the resin S preferably has a structural unit containing an acid-dissociative group in view of improving suppression of the development defects of the photoresist composition. The structural unit containing an acid-dissociative group may be, for example, the structural unit (p) in the resin P.

Also, the resin S preferably has an alkali-dissociative group. When the resin S has an alkali-dissociative group, the resist film surface can be effectively turned from being hydrophobic to being hydrophilic when alkali development is carried out, thereby further improving suppression of the development defects of the photoresist composition. The "alkali-dissociative group" is a group that substitutes for a hydrogen atom of a carboxyl group, a hydroxyl group, or the like and that is dissociated in an aqueous alkali solution (for example, aqueous solution of 2.38 mass % tetramethylammonium hydroxide of 23° C.).

The structural unit (f) is preferably a structural unit represented by the following formula (f-1) (which may hereafter also be referred to as "structural unit (f-1)") or a structural unit represented by the following formula (f-2) (which may hereafter also be referred to as "structural unit (f-2)"). The structural unit (f) may have one kind or two or more kinds of each of the structural unit (f-1) and the structural unit (f-2).

[Structural Unit (f-1)]

The structural unit (f-1) is a structural unit represented by the following formula (f-1). When the resin S contains the structural unit (f-1), the amount of fluorine atoms contained per unit mass can be adjusted.

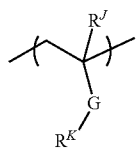

(f-1)

In the above formula (f-1), $R^J$ is a hydrogen atom, a fluorine atom, a methyl group, or a trifluoromethyl group. G is a single bond, an oxygen atom, a sulfur atom, —COO—, —SO$_2$NH—, —CONH—, or —OCONH—. $R^K$ is a monovalent fluorinated chain hydrocarbon group having 1 to 6 carbon atoms or a monovalent fluorinated alicyclic hydrocarbon group having 4 to 20 carbon atoms.

The above $R^J$ is preferably a hydrogen atom or a methyl group, more preferably a methyl group, in view of copolymerizability of the monomers giving the structural unit (f-1).

G is preferably —COO—, —SO$_2$NH—, —CONH—, or —OCONH—, more preferably —COO—.

Examples of the monovalent fluorinated chain hydrocarbon group having 1 to 6 carbon atoms represented by the above $R^K$ include a group in which a part or whole of the hydrogen atoms that the straight-chain or branched-chain alkyl group having 1 to 6 carbon atoms has are substituted with fluorine atoms.

Examples of the monovalent fluorinated alicyclic hydrocarbon group having 4 to 20 carbon atoms represented by the above $R^K$ include a group in which a part or whole of the hydrogen atoms that the monocyclic or polycyclic hydrocarbon group having 4 to 20 carbon atoms has are substituted with fluorine atoms.

$R^K$ is preferably a fluorinated chain hydrocarbon group, more preferably 2,2,2-trifluoroethyl group or 1,1,1,3,3,3-hexafluoro-2-propyl group, and still more preferably 2,2,2-trifluoroethyl group.

When the resin S has the structural units (f-1), a lower limit of the content of the structural unit (f-1) is preferably 10 mol %, more preferably 20 mol %, relative to the total structural units constituting the resin S. An upper limit of the content is preferably 100 mol %, more preferably 90 mol %. By setting the content of the structural unit (f-1) to be within the aforementioned range, the amount of the fluorine atoms contained in the resin S per unit mass can be more suitably adjusted.

[Structural Unit (f-2)]

The structural unit (f-2) is represented by the following formula (f-2). When the resin S contains the structural unit (f-2), the solubility to the alkali development liquid is improved, and generation of development defects can be suppressed.

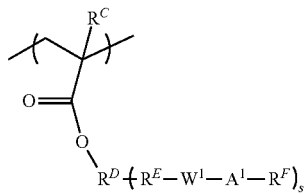

(f-2)

The structural unit (f-2) can be roughly classified into two, that are, (x) one having an alkali-soluble group and (y) one having a group that is dissociated by action of an alkali to increase the solubility to the alkali development liquid (which may hereafter be also referred to as "alkali-dissociative group"). In both of the cases (x) and (y), in the above formula (f-2), $R^C$ is a hydrogen atom, a fluorine atom, a methyl group, or a trifluoromethyl group. $R^D$ is a single bond, a (s+1)-valent hydrocarbon group having 1 to 20 carbon atoms, a structure in which an oxygen atom, a sulfur atom, —NR$^{dd}$—, a carbonyl group, —COO—, or —CONH— is bonded to the terminal end on the $R^E$ side of this hydrocarbon group, or a structure in which a part of the hydrogen atoms that this hydrocarbon group has are substituted with an organic group having a heteroatom. $R^{dd}$ is a hydrogen atom or a monovalent hydrocarbon group having 1 to 10 carbon atoms. Also, s is an integer of 1 to 3. However, when s is 1, $R^D$ in no cases is a single bond.

When the structural unit (f-2) is (x) one having an alkali-soluble group, $R^F$ is a hydrogen atom, and $A^1$ is an oxygen atom, —COO—*, or —SO$_2$O—*. The symbol * denotes the site bonded to $R^F$. $W^1$ is a single bond, a hydrocarbon group having 1 to 20 carbon atoms, or a divalent fluorinated hydrocarbon group. When $A^1$ is an oxygen atom, $W^1$ is a fluorinated hydrocarbon group having a fluorine atom or a fluoroalkyl group at the carbon atom bonded to $A^1$. $R^E$ is a single bond or a divalent organic group having 1 to 20 carbon atoms. When s is 2 or 3, the plurality of $R^E$, $W^1$, $A^1$, and $R^F$ may each be the same or different. When the structural unit (f-2) has (x) an alkali-soluble group, the affinity to the alkali development liquid is enhanced, and development defects can be suppressed. The structural unit (f-2) having (x) an alkali-soluble group is particularly preferably a structural unit in which $A^1$ is an oxygen atom, and $W^1$ is 1,1,1,3,3,3-hexafluoro-2,2-methanediyl group.

When the structural unit (f-2) is (y) one having an alkali-dissociative group, $R^F$ is a monovalent organic group having 1 to 30 carbon atoms, and $A^1$ is an oxygen atom, —NR$^{aa}$—, —COO—*, or —SO$_2$O—*. $R^{aa}$ is a hydrogen atom or a monovalent hydrocarbon group having 1 to 10 carbon atoms. The symbol * denotes the site bonded to $R^F$. $W^1$ is a single bond or a divalent fluorinated hydrocarbon group having 1 to 20 carbon atoms. $R^E$ is a single bond or a divalent organic group having 1 to 20 carbon atoms. When A' is —COO—* or —SO$_2$O—*, then $W^1$ or $R^F$ has a fluorine atom at the carbon atom bonded to $A^1$ or a carbon atom adjacent thereto. When $A^1$ is an oxygen atom, $W^1$ and $R^E$ are a single bond; $R^D$ is a structure in which a carbonyl group is bonded to the terminal end on the $R^E$ side of the hydrocarbon group having 1 to 20 carbon atoms; and $R^F$ is an organic group having a fluorine atom. When s is 2 or 3, the plurality of $R^E$, $W^1$, $A^1$, and $R^F$ may each be the same or different. When the structural unit (f-2) has (y) an alkali-dissociative group, the resist film surface is turned from being hydrophobic to being hydrophilic in the alkali development step. As a result of this, the affinity to the development liquid is greatly enhanced, and development defects can be more efficiently suppressed. The structural unit (f-2) having (y) an alkali-dissociative group is particularly preferably a structural unit in which A' is —COO—*, and one or both of $R^F$ and W' have a fluorine atom.

$R^C$ is preferably a hydrogen atom or a methyl group, more preferably a methyl group, in view of copolymerizability of the monomers giving the structural unit (f-2), or the like.

When $R^E$ is a divalent organic group, a group having a lactone structure is preferable; a group having a polycyclic lactone structure is more preferable; and a group having a norbornane lactone structure is still more preferable.

When the resin S has the structural unit (f-2), a lower limit of the content of the structural unit (f-2) is preferably 0.1 mol %, more preferably 5 mol %, relative to the total structural units constituting the resin S. An upper limit of the content is preferably 50 mol %, more preferably 40 mol %. By setting the content of the structural unit (f-2) to be within the aforementioned range, the resist film surface formed from the photoresist composition can be more suitably changed from being water-repellent to being hydrophilic between before and after the alkali development.

A lower limit of the content of the structural unit (f) is preferably 10 mol %, more preferably 20 mol %, and still more preferably 25 mol %, relative to the total structural units constituting the resin S. An upper limit of the content is preferably 100 mol %, more preferably 90 mol %, and still more preferably 80 mol %.

A lower limit of the content of the structural unit containing an acid-dissociative group in the resin S is preferably 10 mol %, more preferably 20 mol %, and still more preferably 25 mol %, relative to the total structural units constituting the resin S. An upper limit of the content is preferably 90 mol %, more preferably 80 mol %, and still more preferably 75 mol %. By setting the content of the structural unit containing an acid-dissociative group to be within the aforementioned range, suppression of the development defects of the photoresist composition can be further improved.

When the photoresist composition contains the resin S, a lower limit of the content of the resin S is preferably 0.1 part by mass, more preferably 0.5 part by mass, still more preferably 1 part by mass, and particularly preferably 2 parts by mass, relative to 100 parts by mass of the resin P. An upper limit of the above content is preferably 30 parts by mass, more preferably 20 parts by mass, still more preferably 15 parts by mass, and particularly preferably 10 parts by mass. The photoresist composition may contain one kind or two or more kinds of the resin S.

The resin S can be synthesized by a method similar to that of the above-described resin P.

A lower limit of Mw of the resin S by GPC is preferably 1,000, more preferably 3,000, still more preferably 4,000, and particularly preferably 5,000. An upper limit of the above Mw is preferably 50,000, more preferably 30,000, still more preferably 20,000, and particularly preferably 10,000. By setting the Mw of the resin S to be within the aforementioned range, the application property of the photoresist composition and the suppression of the development defects are improved.

A lower limit of the ratio (Mw/Mn) of Mw to Mn of the resin S by GPC is typically 1, preferably 1.2. An upper limit of the above ratio is preferably 5, more preferably 3, and still more preferably 2.

The photoresist composition is prepared, for example, by dissolving the aforementioned resin P, acid generating agent Q, and optional acid diffusion controlling agent R and the like in accordance with the needs into a solvent. Also, the photoresist composition is used typically after being filtrated through a filter having a pore diameter of about 30 nm. The total solid component concentration of the photoresist composition is preferably 0.2 mass % to 20 mass % in view of the facility in application.

(Step (4))

In the step (4), the resist film having the liquid immersion top coat layer formed thereon is subjected to liquid immersion lithography. A liquid immersion medium is provided on the liquid immersion top coat layer, and the resist film is subjected to liquid immersion lithography via the liquid immersion medium.

As the liquid immersion medium, a liquid having a higher refractive index than that of air is typically used. Water is preferably used as the liquid immersion medium, and pure water is more preferably used. Here, in accordance with the needs, the pH of the liquid immersion medium may be adjusted. An exposure light is radiated from the exposure apparatus in a state in which this liquid immersion medium is interposed, that is, in a state in which the gap between the lens of the exposure apparatus and the liquid immersion top coat layer is filled with the liquid immersion medium, so as to expose the liquid immersion top coat layer and the photoresist film via a mask having a predetermined pattern.

The exposure light used in this liquid immersion exposure can be suitably selected in accordance with the type of the photoresist film and the liquid immersion top coat layer, and examples thereof include visible light; ultraviolet rays such as a g-beam and an i-beam; far infrared rays such as an excimer laser; an X-ray such as a synchrotron radiation beam; a charged particle beam such as an electron beam; and EUV (extreme ultraviolet ray, wavelength: 13.5 nm). Among these, an ArF excimer laser beam (wavelength of 193 nm) and a KrF excimer laser beam (wavelength of 248 nm) are preferable, and an ArF excimer laser beam is more preferable. Also, the conditions for radiation of the exposure light, for example, the exposure amount and the like, may be suitably set in accordance with the blending composition of the photoresist composition and the resist top coat layer forming resin composition, the type of the additives contained in these, and the like.

After the above liquid immersion exposure, the substrate is preferably subjected to post-exposure baking (PEB) in order to improve the resolution, the pattern shape, the development properties, and the like of the resulting resist pattern. The PEB temperature can be suitably set in accordance with the type and the like of the photoresist composition and the resist top coat layer forming resin composition that are put to use; however, the PEB temperature is typically 30° C. to 200° C., preferably 50° C. to 150° C. The PEB time is typically 5 seconds to 600 seconds, preferably 10 seconds to 300 seconds.

(Step (5))

In the step (5), the resist film subjected to the above liquid immersion exposure is developed. This can yield a desired resist pattern. According to the method of forming the resist pattern, the liquid immersion top coat layer is formed by using the top coat layer composition, so that the liquid immersion top coat layer can be easily removed by the development liquid during the development or by the washing liquid during the washing when washing is carried out after the development. In other words, there is no need of a separate peeling step for removing the liquid immersion top coat layer. In the present step, either alkali development or organic solvent development may be carried out. By the alkali development, a positive-type resist pattern is obtained. By the organic solvent development, a negative-type resist pattern is obtained. Among these, the alkali development is preferable.

When the alkali development is performed, the development liquid is preferably an alkaline aqueous solution in which at least one kind of alkaline compounds such as sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetraalkylammonium hydroxides (for example, tetramethylammonium hydroxide (TMAH), tetraethylammonium hydroxide, and the like), pyrrole, piperidine, choline, 1,8-diazabicyclo-[5.4.0]-7-undecene, and 1,5-diazabicyclo-[4.3.0]-5-nonane is dissolved. Among these, an aqueous solution of tetraalkylammonium hydroxides is preferable, and an aqueous solution of TMAH is more preferable.

A suitable amount of a water-soluble organic solvent such as an alcohol such as methanol or ethanol, or a surfactant, for example, may be added into the development liquid in the above alkali development.

Also, in the case of the organic solvent development, a development liquid containing an organic solvent is used. The organic solvent may be, for example, one similar to the solvent exemplified as the solvent contained in the resist top coat layer forming resin composition described above. Among these, an ether-based solvent, a ketone-based solvent, and an ester-based solvent are preferable, and n-butyl acetate, isopropyl acetate, amyl acetate, anisole, 2-butanone, methyl-n-butyl ketone, and methyl-n-amyl ketone are more preferable. One kind or two or more kinds of these organic solvents may be used.

The content of the organic solvent in the development liquid for the organic solvent development is preferably 80 mass % or more, more preferably 90 mass % or more, and still more preferably 100 mass %. By setting the content of the organic solvent in the development liquid to be within the aforementioned range, the dissolution contrast between the exposed part and the non-exposed part can be improved and, as a result of this, a resist pattern excellent in lithography characteristics can be formed. Examples of the components other than the organic solvent include water and silicone oil.

The resist film subjected to the above development is preferably washed with use of a rinsing liquid and dried. As the rinsing liquid, water is preferable in the case of the alkali development, and ultrapure water is more preferable. In the case of the organic solvent development, an organic solvent is preferable as the rinsing liquid, and an alcohol-based solvent is more preferable.

<<Method for Producing Fluorine-Containing Resin>>

A method for producing a fluorine-containing resin according to this embodiment includes polymerizing a monomer solution containing at least a fluorine-containing monomer in the presence of a polymerization initiator that cleaves to generate an active species containing 7 or more carbon atoms in total. As the polymerization step, the polymerization step in the method for producing a composition for resist top coat layer can suitably be employed. In this production method, a fluorine-containing resin is synthesized using a specific polymerization initiator, and therefore the fluorine-containing resin can exhibit excellent water-repellency and is suitably used for forming a resist top coat layer.

<<Method for Improving Water-Repellency of Resist Top Coat Layer>>

A method for improving water-repellency of a resist top coat layer according to this embodiment includes:

polymerizing a monomer solution containing at least a fluorine-containing monomer in the presence of a polymerization initiator that cleaves to generate an active species containing 7 or more carbon atoms in total to obtain a fluorine-containing resin A;

mixing the fluorine-containing resin A and a solvent to prepare a composition for resist top coat layer; and applying the composition for resist top coat layer onto a resist film to form a liquid immersion top coat layer.

In the method for improving water-repellency, a resist top coat layer (liquid immersion top coat layer) is formed using a composition for resist top coat layer containing a fluorine-containing resin obtained by synthesis in the presence of a specific polymerization initiator, and therefore the water-repellency of the resist top coat layer can efficiently be improved. As the polymerization step and the mixing step, the polymerization step and the mixing step in the method for producing a composition for resist top coat layer can suitably be employed. As the liquid immersion top coat layer forming step, the step (3) in the method for forming a resist pattern can suitably be employed.

(Dynamic Receding Contact Angle of Liquid Immersion Top Coat Layer)

The dynamic receding contact angle of water on a liquid immersion top coat layer formed using the composition for resist top coat layer is preferably 80° or more, more preferably 81° or more, even more preferably 82° or more, even more preferably 83° or more from the viewpoint of throughput of liquid immersion lithography and yield. The dynamic receding contact angle of the top coat layer within the above range makes it possible to further enhance the water-repellency of the top coat layer and more efficiently prevent a watermark defect.

EXAMPLES

Hereinbelow, the present invention will be described in detail with reference to examples, but is not limited to the following examples unless departing from the spirit thereof.
($^{13}$C-NMR Analysis)

$^{13}$C-NMR was performed using a nuclear magnetic resonator (JNM-ECX400 manufactured by JEOL Ltd.), CDCl$_3$ as a measurement solvent, and tetramethylsilane (TMS) as an internal standard.
(Measurement of Mw and Mn)

The Mw and Mn of a resin were measured by gel permeation chromatography (GPC) under the following conditions.

GPC columns: G2000HXL×2, G3000HXL×1, G4000HXL×1 (manufactured by Tosoh Corporation)

Elution solvent: tetrahydrofuran

Flow rate: 1.0 mL/min

Column temperature: 40° C.

Standard substance: monodisperse polystyrene

Detector: differential refractometer
<Synthesis of Resins A to C for Composition for Resist Top Coat Layer>

Fluorine-containing resins A, a resin B and resins C were synthesized using compounds (M-1) to (M-7) represented by the following formulas.

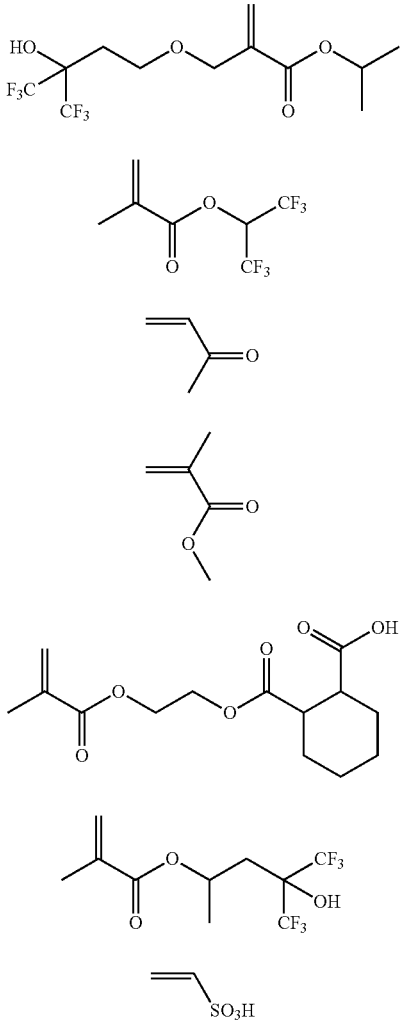
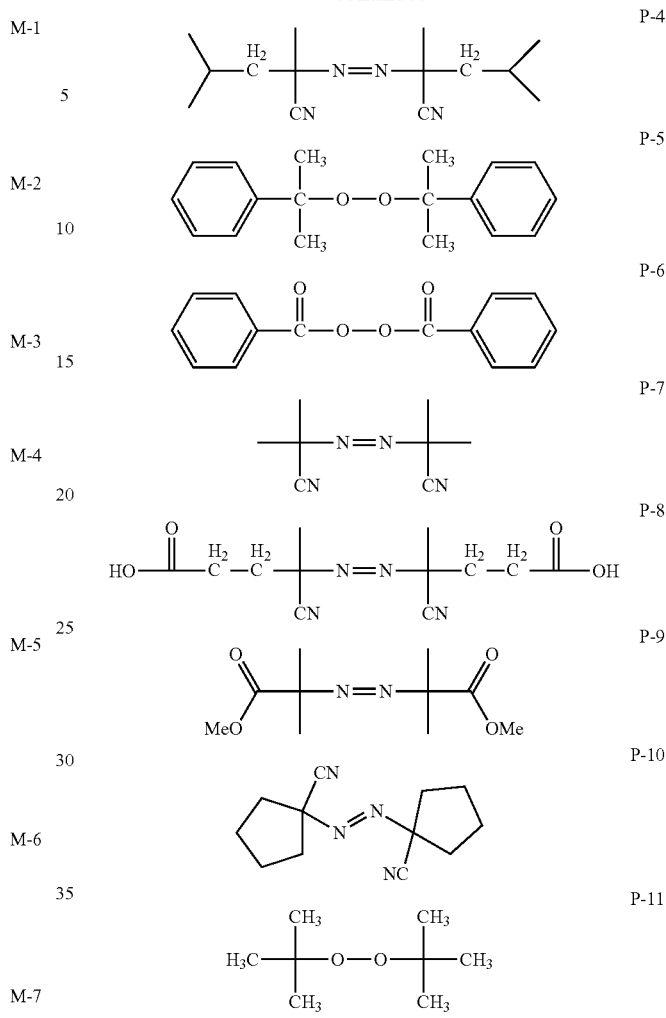

The fluorine-containing resins A were synthesized using compounds (P-1) to (P-11) represented by the following formulas as polymerization initiators.

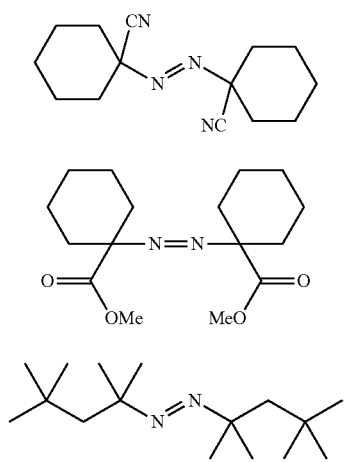

Synthesis Example 1: Synthesis of Fluorine-Containing Resin (A-1)

The compound (M-1) and the compound (M-2) were blended in a mole ratio of 45/55, and methyl ethyl ketone (30 parts by mass) was added thereto. The polymerization initiator (P-1) was added thereto in an amount of 6.5 mol % to prepare a solution for dropping polymerization. Methyl ethyl ketone (70 parts by weight) was placed in a reaction container, and the reaction container was purged with nitrogen for 30 minutes. The temperature in the reaction container was raised to 80° C., and the solution was added dropwise for 3 hours with stirring. The start of dropping was regarded as the start of polymerization, and a polymerization reaction was performed for 6 hours. After the polymerization reaction was completed, the polymerization solution was cooled to 25° C. 100 parts by weight of methanol and 500 parts by weight of hexane were added to the obtained polymerization solution, and the resulting mixture was separated with a separating funnel. Then, 50 parts by weight of methanol and 300 parts by weight of hexane were added to a lower layer obtained by separation, and the resulting mixture was separated with a separating funnel. Then, 100 parts by weight of dimethyl-2,2'-azobis(2-methylpropionate) and 300 parts by weight of water were added to a lower layer finally obtained by separation, and the resulting mixture was separated with a separating funnel to collect an upper layer. The upper layer was concentrated, and the solvent other than dimethyl-2,2'-azobis(2-methylpropionate) was removed to obtain a polymer (A-1) solution. The Mw of the polymer (A-1) was 11,500, and the Mw/Mn of the polymer (A-1) was 1.64. As a result of $^{13}$C-NMR analysis, the content of a structural unit derived from the compound (M-1) was 40.0 mol % and the content of a structural unit derived from the compound (M-2) was 60.0 mol %.

Synthesis Examples 2 to 11: Synthesis of Fluorine-Containing Resins (A-2) to (A-11)

Polymerization was performed in the same manner as in Synthesis Example 1 except that the amount (mol %) of each of the polymerization initiators (P-2) to (P-11) added was adjusted so that the resulting polymer had a Mw of 12,000±1,000. The Mw, Mw/Mn, content of a structural unit derived from the compound (M-1), and content of a structural unit derived from the compound (M-2) of the polymer are shown in Table 1.

the separation, a lower layer was collected. The solvent in the collected lower layer solution was replaced with 4-methyl-2-pentanol so that the total amount of the lower layer liquid was adjusted to 250 g, and separation purification with 250 g of water was performed. An upper layer was collected, and the solvent in the upper layer was replaced with 4-methyl-2-pentanol to obtain a solution containing a resin (B-1) (yield: 77%). The resin (B-1) had a Mw of 12,130 and a Mw/Mn of 1.65.

Synthesis Example 13: Synthesis of Resin (C-1)

6.2 g of the compound (M-3), 15.9 g of the compound (M-4), 7.9 g of the compound (M-7), and 3.6 g of 2,2-azobis (methyl 2-methylisopropionate) as a polymerization initiator were dissolved in 30 g of isopropanol to prepare a monomer solution. 30 g of isopropanol was placed in a 200-mL three-necked flask equipped with a thermometer and a dropping funnel, and the flask was purged with nitrogen for 30 minutes. After nitrogen purging, the inside of the flask was heated to 80° C. while stirred with a magnetic stirrer,

TABLE 1

|  | Resin | Polymerization initiator | Monomer Type | Content (mol %) | Type | Content (mol %) | Yield (%) | Physical property value Mw | Mw/Mn |
|---|---|---|---|---|---|---|---|---|---|
| Synthesis Example 1 | Resin A-1 | P-1 | M-1 | 40 | M-2 | 60 | 75 | 11,500 | 1.64 |
| Synthesis Example 2 | Resin A-2 | P-2 | M-1 | 39 | M-2 | 61 | 73 | 11,200 | 1.62 |
| Synthesis Example 3 | Resin A-3 | P-3 | M-1 | 38 | M-2 | 62 | 77 | 11,000 | 1.65 |
| Synthesis Example 4 | Resin A-4 | P-4 | M-1 | 41 | M-2 | 59 | 77 | 12,100 | 1.61 |
| Synthesis Example 5 | Resin A-5 | P-5 | M-1 | 41 | M-2 | 59 | 72 | 11,800 | 1.68 |
| Synthesis Example 6 | Resin A-6 | P-6 | M-1 | 40 | M-2 | 60 | 78 | 11,900 | 1.62 |
| Synthesis Example 7 | Resin A-7 | P-7 | M-1 | 40 | M-2 | 60 | 75 | 11,200 | 1.62 |
| Synthesis Example 8 | Resin A-8 | P-8 | M-1 | 39 | M-2 | 61 | 75 | 11,000 | 1.65 |
| Synthesis Example 9 | Resin A-9 | P-9 | M-1 | 38 | M-2 | 62 | 72 | 12,100 | 1.61 |
| Synthesis Example 10 | Resin A-10 | P-10 | M-1 | 41 | M-2 | 59 | 69 | 11,800 | 1.68 |
| Synthesis Example 11 | Resin A-11 | P-11 | M-1 | 41 | M-2 | 59 | 74 | 11,900 | 1.62 |

Synthesis Example 12: Synthesis of Resin (B-1)

50 g of the compound (M-6) and 1.95 g of 2,2-azobis (methyl 2-methylisopropionate) were dissolved in 50 g of 2-butanone to previously prepare a monomer solution. 50 g of 2-butanone was placed in a 500-mL three-necked flask equipped with a thermometer and a dropping funnel, and the flask was purged with nitrogen for 30 minutes. After nitrogen purging, the inside of the flask was heated to 80° C. while stirred with a magnetic stirrer, and the previously-prepared monomer solution was dropped into the flask with a dropping funnel for 2 hours. After the completion of dropping, the reaction was further continued for 2 hours, 1.17 g of 2,2-azobis(methyl 2-methylisopropionate) was further added, the reaction was further continued for 2 hours, followed by cooling to 30° C. or lower to obtain a polymerization reaction liquid. Then, the obtained polymerization liquid was transferred into a separating funnel and 50 g of methanol and 600 g of n-hexane were placed in the separating funnel to perform separation purification. After the separation, a lower layer was collected. The lower layer liquid was diluted with 2-butanone so that the amount of the diluted lower layer liquid was 100 g. The diluted lower layer liquid was again transferred into a separating funnel, 50 g of methanol and 600 g of n-hexane were placed in the separating funnel to again perform separation purification. After and the previously-prepared monomer solution was dropped into the flask with a dropping funnel for 3 hours. After the dropping was completed, the reaction was further continued for 3 hours, followed by cooling to 30° C. or lower to obtain a polymerization reaction liquid. The polymerization liquid was concentrated to 60 g, and 60 g of methanol and 360 g of n-hexane were added to the concentrated liquid in a separating funnel to perform separation purification. After the separation, a lower layer was collected. The solvent in the collected lower layer liquid was replaced with 4-methyl-2-pentanol so that the total amount of the lower layer liquid was adjusted to 256 g, and separation purification with 128 g of methanol and 256 g of pure water was performed to collect 280 g of an upper layer. 140 g of 2-butanone and 280 g of pure water were added to the upper layer, and the resulting mixture was stirred for 30 minutes, and then 400 g of an upper layer was collected, and the solvent in the upper layer was replaced with 4-methyl-2-pentanol to obtain a solution containing a resin (C-1) (yield 52%).

The resin (C-1) had a Mw of 4,500 and a Mw/Mn of 1.60. As a result of $^{13}$C-NMR analysis, the content of a structural unit derived from the compound (M-3) was 30 mol %, the content of a structural unit derived from the compound (M-4) was 62 mol %, and the content of a structural unit derived from the compound (M-7) was 8 mol %.

Synthesis Examples 14 to 18: Synthesis of Resins (C-2) to (C-3) and Resins (D-1) to (D-3)

Resins (C-2) and (C-3) and resins (D-1) to (D-3) were synthesized in the same manner as in the synthesis of the resin (C-1) except that monomers were blended so that the resins had compositions shown in Table 2. It is to be noted that the resins D are in the same category as the resins C, but the resins C were regarded as strongly acidic resins and the resins D were regarded as acidic resins to distinguish the resins D from the resins C for the sake of convenience. The Mw, Mw/Mn, and content of structural unit derived from each of the components as monomers of the obtained polymer are shown in Table 2.

TABLE 2

|  |  | Monomer | | | | | | Yield | Physical property value | |
| --- | --- | --- | --- | --- | --- | --- | --- | --- | --- | --- |
|  |  |  | Content | | Content | | Content | | | |
|  | Resin | Type | (mol %) | Type | (mol %) | Type | (mol %) | (%) | Mw | Mw/Mn |
| Synthesis Example 12 | Resin B-1 | M-6 | 100 | — | — | — | — | 77 | 12,130 | 1.65 |
| Synthesis Example 13 | Resin C-1 | M-3 | 30 | M-4 | 62 | M-7 | 8 | 52 | 4,500 | 1.60 |
| Synthesis Example 14 | Resin C-2 | M-3 | 72 | M-6 | 18 | M-7 | 10 | 57 | 4,100 | 1.65 |
| Synthesis Example 15 | Resin C-3 | M-5 | 90 | M-7 | 10 | — | — | 55 | 4400 | 1.59 |
| Synthesis Example 16 | Resin D-1 | M-3 | 30 | M-4 | 68 | M-7 | 2 | 72 | 8,250 | 1.55 |
| Synthesis Example 17 | Resin D-2 | M-6 | 98 | M-7 | 2 | — | — | 79 | 7,950 | 1.50 |
| Synthesis Example 18 | Resin D-3 | M-5 | 96 | M-7 | 4 | — | — | 76 | 7,650 | 1.52 |

<Preparation of Composition for Resist Top Coat Layer>

Example 1

15 parts by mass of the resin (A-1), 55 parts by mass of the resin (B-1), 5 parts by mass of the resin (C-1), and 25 parts by mass of the resin (D-1) were mixed, 2,500 parts by mass of 4-methyl-2-pentanol (E-1) and 2,500 parts by mass of diisoamyl ether (E-2) as solvents were added to the mixture, and the resulting mixture was filtered through a filter having a pore diameter of 30 nm to prepare a composition for resist top coat layer of Example 1.

It is to be noted that compositions for resist top coat layer were prepared using the following solvents.
(E-1): 4-methyl-2-pentanol
(E-2): diisoamyl ether
(E-3): diisopropylene glycol monomethyl ether Examples 2 to 18 and Comparative Examples 1 to 15

Compositions for resist top coat layer were prepared in the same manner as in Example 1 except that compositions shown in Table 3 were adopted.

<Evaluation>

The following item of each of the obtained compositions for resist top coat layer was evaluated.

(Dynamic Receding Contact Angle (RCA) of Water)

The dynamic receding contact angle of water on the surface of a top coat layer was measured. The composition for resist top coat layer was spin coated on an 8-inch silicon wafer and subjected to PB on a hot plate at 90° C. for 60 seconds to form a top coat layer having a thickness of 30 nm. Then, the receding contact angle was immediately measured using a contact angle meter (DSA-30S manufactured by KRUSS) in the following manner in an environment of a room temperature of 23° C., a humidity of 45%, and an ordinary pressure.

First, the wafer stage position of the contact angle meter was adjusted, and the wafer was set on the adjusted stage. Then, water was injected into a needle, and the position of the needle was finely adjusted to an initial position where a water droplet could be formed on the set wafer. Then, water was discharged from the needle to form a water droplet of 25 μL on the wafer, and the needle was once removed from the water droplet and again lowered at the initial position to be placed in the water droplet. Then, the water droplet was sucked into the needle at a rate of 10 μL/min for 90 seconds while the contact angle was measured once per second 90 times in total. The values of the contact angle measured for 20 seconds from the time point when the measured values of the contact angle became stable were averaged to determine a dynamic receding contact angle RCA (unit: degree (°)).

TABLE 3

| | Composition for resist top coat layer | | | | | | | | | | Evaluation result |
| --- | --- | --- | --- | --- | --- | --- | --- | --- | --- | --- | --- |
| | Resin A | | Resin B | | Resin C | | Resin D | | Solvent E | | |
| | Type | Content (parts by mass) | Type | Content (parts by mass) | Type | Content (parts by mass) | Type | Content (parts by mass) | Type | Content (parts by mass) | RCA |
| Example 1 | A-1 | 15 | B-1 | 55 | C-1 | 5 | D-1 | 25 | E-1/E-2 | 2500/2500 | 84 |
| Example 2 | A-1 | 20 | B-1 | 50 | C-2 | 10 | D-2 | 20 | E-1/E-3 | 2500/2500 | 84 |

TABLE 3-continued

| | Composition for resist top coat layer | | | | | | | | | | Evaluation result RCA |
|---|---|---|---|---|---|---|---|---|---|---|---|
| | Resin A | | Resin B | | Resin C | | Resin D | | Solvent E | | |
| | Type | Content (parts by mass) | Type | Content (parts by mass) | Type | Content (parts by mass) | Type | Content (parts by mass) | Type | Content (parts by mass) | |
| Example 3 | A-1 | 10 | B-1 | 60 | — | — | D-3 | 30 | E-1/E-2/E-3 | 2000/2000/1000 | 84 |
| Example 4 | A-2 | 25 | B-1 | 45 | — | — | D-1 | 30 | E-1/E-2 | 2500/2500 | 84 |
| Example 5 | A-2 | 15 | B-1 | 55 | C-2 | 10 | D-2 | 20 | E-1/E-3 | 2500/2500 | 84 |
| Example 6 | A-2 | 20 | B-1 | 50 | C-3 | 15 | D-3 | 15 | E-1/E-2/E-3 | 2000/2000/1000 | 84 |
| Example 7 | A-3 | 10 | B-1 | 60 | C-1 | 5 | D-1 | 25 | E-1/E-2 | 2500/2500 | 83 |
| Example 8 | A-3 | 25 | B-1 | 45 | — | — | D-2 | 30 | E-1/E-3 | 2500/2500 | 82 |
| Example 9 | A-3 | 15 | B-1 | 55 | C-3 | 15 | D-3 | 15 | E-1/E-2/E-3 | 2000/2000/1000 | 83 |
| Example 10 | A-4 | 15 | B-1 | 55 | C-1 | 5 | D-1 | 25 | E-1/E-2 | 2500/2500 | 82 |
| Example 11 | A-4 | 20 | B-1 | 50 | C-2 | 10 | D-2 | 20 | E-1/E-3 | 2500/2500 | 82 |
| Example 12 | A-4 | 10 | B-1 | 60 | — | — | D-3 | 30 | E-1/E-2/E-3 | 2000/2000/1000 | 81 |
| Example 13 | A-5 | 25 | B-1 | 45 | — | — | D-1 | 30 | E-1/E-2 | 2500/2500 | 82 |
| Example 14 | A-5 | 15 | B-1 | 55 | C-2 | 10 | D-2 | 20 | E-1/E-3 | 2500/2500 | 81 |
| Example 15 | A-5 | 20 | B-1 | 50 | C-3 | 15 | D-3 | 15 | E-1/E-2/E-3 | 2000/2000/1000 | 82 |
| Example 16 | A-6 | 10 | B-1 | 60 | C-1 | 5 | D-1 | 25 | E-1/E-2 | 2500/2500 | 82 |
| Example 17 | A-6 | 25 | B-1 | 45 | — | — | D-2 | 30 | E-1/E-3 | 2500/2500 | 82 |
| Example 18 | A-6 | 15 | B-1 | 55 | C-3 | 15 | D-3 | 15 | E-1/E-2/E-3 | 2000/2000/1000 | 81 |
| Comparative Example 1 | A-7 | 20 | B-1 | 50 | — | — | D-1 | 30 | E-1/E-2 | 2500/2500 | 79 |
| Comparative Example 2 | A-7 | 10 | B-1 | 60 | C-2 | 10 | D-2 | 20 | E-1/E-3 | 2500/2500 | 78 |
| Comparative Example 3 | A-7 | 25 | B-1 | 45 | C-3 | 15 | D-3 | 15 | E-1/E-2/E-3 | 2000/2000/1000 | 79 |
| Comparative Example 4 | A-8 | 15 | B-1 | 55 | C-1 | 5 | D-1 | 25 | E-1/E-2 | 2500/2500 | 78 |
| Comparative Example 5 | A-8 | 20 | B-1 | 50 | — | — | D-2 | 30 | E-1/E-3 | 2500/2500 | 78 |
| Comparative Example 6 | A-8 | 10 | B-1 | 60 | C-3 | 15 | D-3 | 15 | E-1/E-2/E-3 | 2000/2000/1000 | 77 |
| Comparative Example 7 | A-9 | 25 | B-1 | 45 | C-1 | 5 | D-1 | 25 | E-1/E-2 | 2500/2500 | 77 |
| Comparative Example 8 | A-9 | 15 | B-1 | 55 | C-2 | 10 | D-2 | 20 | E-1/E-3 | 2500/2500 | 78 |
| Comparative Example 9 | A-9 | 15 | B-1 | 55 | — | — | D-3 | 30 | E-1/E-2/E-3 | 2000/2000/1000 | 78 |
| Comparative Example 10 | A-10 | 20 | B-1 | 50 | — | — | D-1 | 30 | E-1/E-2 | 2500/2500 | 79 |
| Comparative Example 11 | A-10 | 10 | B-1 | 60 | C-2 | 10 | D-2 | 20 | E-1/E-3 | 2500/2500 | 79 |
| Comparative Example 12 | A-10 | 25 | B-1 | 45 | C-3 | 15 | D-3 | 15 | E-1/E-2/E-3 | 2000/2000/1000 | 79 |
| Comparative Example 13 | A-11 | 15 | B-1 | 55 | C-1 | 5 | D-1 | 25 | E-1/E-2 | 2500/2500 | 75 |
| Comparative Example 14 | A-11 | 20 | B-1 | 50 | — | — | D-2 | 30 | E-1/E-3 | 2500/2500 | 76 |
| Comparative Example 15 | A-11 | 10 | B-1 | 60 | C-3 | 15 | D-3 | 15 | E-1/E-2/E-3 | 2000/2000/1000 | 74 |

As can be seen from the results shown in Table 3, resist top coat layers excellent in dynamic receding contact angel can be formed using the compositions for resist top coat layer of Examples.

Obviously, numerous modifications and variations of the present invention are possible in light of the above teachings. It is therefore to be understood that within the scope of the appended claims, the invention may be practiced otherwise than as specifically described herein.

The invention claimed is:

1. A method for producing a composition for resist top coat layer, comprising:

polymerizing a monomer solution comprising a fluorine-containing monomer in a presence of a polymerization initiator that cleaves to generate an active species having 7 or more carbon atoms in total to obtain a fluorine-containing resin A; and mixing the fluorine-containing resin A, a resin B having a fluorine atom mass content lower than a fluorine atom mass content of the fluorine-containing resin A, and a solvent, wherein the polymerization initiator has an alicyclic structure having 3 to 12 carbon atoms, and wherein the monomer solution comprises:
 a first fluorine-containing monomer represented by formula (2-a); and
 a second fluorine-containing monomer having a partial structure represented by formula (3) and having a fluorine atom mass content higher than a fluorine atom mass content of the first fluorine-containing monomer:

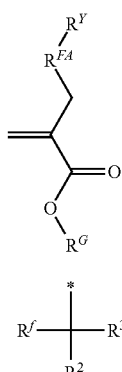

(2-a)

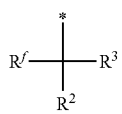

(3)

wherein in the formula (2-a), $R^Y$ is a partial structure represented by formula (2), $R^{FA}$ is a single bond or a divalent linking group, and $R^G$ is a hydrogen atom or a monovalent organic group, in the formula (3), $R^f$ is a fluorine atom or a fluoroalkyl group having 1 to 3 carbon atoms $R^2$ and $R^3$ are each independently a hydrogen atom, a fluorine atom, an alkyl group having 1 to 3 carbon atoms, or a fluoroalkyl group having 1 to 3 carbon atoms, and * is a binding site for another portion,

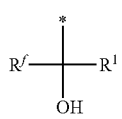

(2)

wherein $R^f$ is as defined in the formula (3), $R^1$ is a hydrogen atom, a fluorine atom, an alkyl group having 1 to 3 carbon atoms, or a fluoroalkyl group having 1 to 3 carbon atoms, and * is a binding site for $R^{FA}$.

2. The method for producing a composition for resist top coat layer according to claim 1, wherein the alicyclic structure is represented by formula (1):

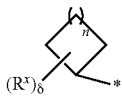

(1)

wherein $R^X$ is a cyano group or an alkoxycarbonyl group having 2 to 8 carbon atoms, n is an integer of 0 to 8, δ is an integer of 0 to (2n+5), * is a binding site for another portion, and when two or more $R^X$s are present, the $R^X$s are the same or different from each other.

3. The method for producing a composition for resist top coat layer according to claim 1, wherein the alicyclic structure is represented by formula (1-1):

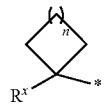

(1-1)

wherein $R^X$ is a cyano group or an alkoxycarbonyl group having 2 to 8 carbon atoms, n is an integer of 2 to 6, and * is a binding site for another portion.

4. The method for producing a composition for resist top coat layer according to claim 1, wherein the polymerization initiator is at least one selected from the group consisting of an azo compound and an organic peroxide.

5. The method for producing a composition for resist top coat layer according to claim 1, wherein when the fluorine-containing resin A, the resin B, and the solvent are mixed, a resin C is further added, the resin C being different from the fluorine-containing resin A and the resin B and comprising at least one selected from the group consisting of a sulfo group and a carboxyl group.

6. The method for producing a composition for resist top coat layer according to claim 1, wherein the solvent is at least one selected from the group consisting of a monovalent aliphatic alcohol having 3 to 8 carbon atoms, a dialkyl ether having 6 to 12 carbon atoms, a monoalkyl ether of a monoalkylene glycol having 2 to 4 carbon atoms, a monoalkyl ether monocarboxylate of a monoalkylene glycol having 2 to 4 carbon atoms, a monoalkyl ether of a dialkylene glycol having 4 to 8 carbon atoms, and a monoalkyl ether monocarboxylate of a dialkylene glycol having 4 to 8 carbon atoms.

7. The method for producing a composition for resist top coat layer according to claim 6, wherein the solvent comprises:
at least one selected from the group consisting of a monovalent aliphatic alcohol having 3 to 8 carbon atoms and a dialkyl ether having 6 to 12 carbon atoms; and
at least one selected from the group consisting of a monoalkyl ether of a monoalkylene glycol having 2 to 4 carbon atoms and a monoalkyl ether of a dialkylene glycol having 4 to 8 carbon atoms.

8. A method for forming a resist pattern comprising:
applying a composition for resist top coat layer onto a resist film to form a liquid immersion top coat layer;
subjecting the resist film having the liquid immersion top coat layer formed thereon to liquid immersion lithography; and
developing the resist film subjected to liquid immersion lithography,
wherein the composition for resist top coat layer is produced by the method for producing a composition for resist top coat layer according to claim 1.

9. The method for forming a resist pattern according to claim 8, wherein the alicyclic structure is represented by formula (1):

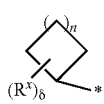

(1)

wherein $R^X$ is a cyano group or an alkoxycarbonyl group having 2 to 8 carbon atoms, n is an integer of 0 to 8, δ is an integer of 0 to (2n+5), * is a binding site for another portion, and when two or more $R^X$s are present, the $R^X$s are the same or different from each other.

10. The method for forming a resist pattern according to claim 8, wherein the alicyclic structure is represented by formula (1-1):

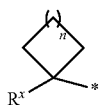

(1-1)

wherein $R^x$ is a cyano group or an alkoxycarbonyl group having 2 to 8 carbon atoms, n is an integer of 2 to 6, and * is a binding site for another portion.

11. The method for forming a resist pattern according to claim 8, wherein when the fluorine-containing resin A, the resin B, and the solvent are mixed, a resin C is further added, the resin C being different from the fluorine-containing resin A and the resin B and comprising at least one selected from the group consisting of a sulfo group and a carboxyl group.

12. A method for improving water-repellency of a resist top coat layer, comprising:

applying a composition for resist top coat layer onto a resist film to form a liquid immersion top coat layer, wherein the composition for resist top coat layer is produced by the method for producing a composition for resist top coat layer according to claim 1.

13. The method for improving water-repellency of a resist top coat layer according to claim 12, wherein a dynamic receding contact angle of water on the liquid immersion top coat layer is 82° or more.

14. The method for improving water-repellency of a resist top coat layer according to claim 12, wherein the alicyclic structure is represented by formula (1):

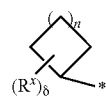

(1)

wherein $R^x$ is a cyano group or an alkoxycarbonyl group having 2 to 8 carbon atoms, n is an integer of 0 to 8, δ is an integer of 0 to (2n+5), * is a binding site for another portion, and when two or more $R^x$s are present, the $R^x$s are the same or different from each other.

15. The method for improving water-repellency of a resist top coat layer according to claim 12, wherein the alicyclic structure is represented by formula (1-1):

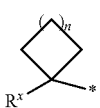

(1-1)

wherein $R^x$ is a cyano group or an alkoxycarbonyl group having 2 to 8 carbon atoms, n is an integer of 2 to 6, and * is a binding site for another portion.

16. The method for improving water-repellency of a resist top coat layer according to claim 12, wherein when the fluorine-containing resin A, the resin B, and the solvent are mixed, a resin C is further added, the resin C being different from the fluorine-containing resin A and the resin B and comprising at least one selected from the group consisting of a sulfo group and a carboxyl group.

\* \* \* \* \*